(12) United States Patent
Costello

(10) Patent No.: US 8,506,323 B2
(45) Date of Patent: Aug. 13, 2013

(54) CABLE ASSEMBLY FOR A CONNECTOR SYSTEM

(71) Applicant: Tyco Electronics Corporation, Berwyn, PA (US)

(72) Inventor: Brian Patrick Costello, Scotts Valley, CA (US)

(73) Assignee: Tyco Electronics Corporation, Berwyn, PA (US)

(*) Notice: Subject to any disclaimer, the term of this patent is extended or adjusted under 35 U.S.C. 154(b) by 0 days.

(21) Appl. No.: 13/685,137

(22) Filed: Nov. 26, 2012

(65) Prior Publication Data

US 2013/0084735 A1 Apr. 4, 2013

Related U.S. Application Data

(63) Continuation of application No. 12/944,336, filed on Nov. 11, 2010, now Pat. No. 8,398,429.

(51) Int. Cl.
*H01R 11/00* (2006.01)

(52) U.S. Cl.
USPC ............................. 439/505; 439/65; 439/941

(58) Field of Classification Search
USPC ......... 439/92, 98, 101, 108, 502, 505, 59–62, 439/65, 941
See application file for complete search history.

(56) References Cited

U.S. PATENT DOCUMENTS

| | | | |
|---|---|---|---|
| 3,963,300 A * | 6/1976 | Patton et al. | 439/638 |
| 6,336,826 B1 * | 1/2002 | Kraft | 439/498 |
| 7,108,556 B2 * | 9/2006 | Cohen et al. | 439/607.08 |
| 7,134,908 B2 * | 11/2006 | Wu | 439/502 |
| 7,331,802 B2 * | 2/2008 | Rothermel et al. | 439/108 |
| 7,621,781 B2 * | 11/2009 | Rothermel et al. | 439/607.05 |
| 7,758,385 B2 * | 7/2010 | Davis et al. | 439/626 |

* cited by examiner

*Primary Examiner* — Khiem Nguyen

(57) ABSTRACT

A cable assembly includes a first header connector that includes a housing that holds a plurality of contacts. The housing of the first header connector has a first mating interface. The cable assembly also includes a second header connector having a housing that holds a plurality of contacts. The housing of the second header connector has a second mating interface facing in an opposite direction from the first mating interface. The first and second header connectors are identical to one another. A cable bundle has a plurality of cables extending between the first and second header connectors. The cables are connected between the contacts of the first header connector and corresponding contacts of the second header connector.

14 Claims, 15 Drawing Sheets

CABLE ASSEMBLY FOR A CONNECTOR SYSTEM

CROSS REFERENCE TO RELATED APPLICATIONS

This application is a continuation of and claims the benefit of U.S. patent application Ser. No. 12/944,336 filed Nov. 11, 2010, the subject matter of which is herein incorporated by reference in its entirety.

BACKGROUND OF THE INVENTION

The subject matter herein relates generally to cable assemblies, and more particularly to cable assemblies for connector systems.

Some connector systems, such as network switches or computer servers with switching capability, include large backplanes with several switch cards and line cards plugged into the backplane. Generally, the line cards bring data from external sources into the system. The switch cards contain circuitry that may switch data from one line to another. Traces in the backplane interconnect the line cards and the appropriate switch cards. Other connector systems utilize midplanes to interconnect several switch cards and line cards plugged into the midplane. The midplane includes a printed circuit board to which the switch cards and line cards are connected. The midplane provides connectors on both sides of the circuit board, allowing daughter cards, such as the switch cards and line cards, to be connected on both sides of the midplane. The midplane circuit board provides conductive paths between the line cards and the switch cards.

Some signal loss is inherent in a trace through the midplane circuit board. As the number of card connections increase, more traces are required in the backplane or the midplane. The increased number of traces and the length of the traces introduce more and more signal loss, particularly at higher signal speeds.

Additionally, most connector systems provide for the connection of multiple connectors from the switch card or line card to the backplane or midplane at one time. Alignment of the connectors is problematic. Holding the connectors on the circuit boards within tight tolerances increases the cost of the connector system.

Furthermore, some connector systems define standard pass through connector systems, in which a plurality of connectors are provided on the backplane or the midplane, and the line cards and switch cards are plugged into the midplane in parallel orientations (e.g., both horizontal orientation or both vertical orientation). Other connector systems utilize inverted pass through connectors, wherein the connectors on one side of the midplane are oriented 180° with respect to the connectors on the opposite side of the midplane. The line cards and the switch cards are both plugged in, in the same orientation (e.g., a horizontal orientation or a vertical orientation), however the line cards and the switch cards may be offset due to the inverted orientations of the connectors. Other connector systems define orthogonal midplane connector systems, in which the connectors on one side of the midplane are oriented at 90° or 270° with respect to the connectors on other side of the midplane. Typically, different types of electrical connectors are designed for each of the connector systems, which increases the overall cost of the connector system. The different types electrical connectors for use in the midplane connector system generally degrades high speed signals passed therethrough due to discontinuities and the asymmetric nature of the connector configuration. Additionally, the complex design of the connectors, particularly with the connectors used in orthogonal midplane applications, increase the overall cost of the connector system.

Moreover, midplane connectors systems typically have a midplane circuit board positioned between the electrical connectors on opposite sides of the midplane circuit board. The midplane circuit board restricts airflow from one side of the circuit board to the other side of the circuit board. With high speed connector systems, the temperature of the components used in the connector system are typically higher, and heat dissipation from such components heretofore has proven difficult.

A need remains for a midplane connector system that is cost effective and reliable. A need remains for a midplane connector system for use in high speed signal applications, such as connector systems capable supporting 25 GB and higher signal speeds. A need remains a connector system that provides adequate heat dissipation from the components of the overall system.

BRIEF DESCRIPTION OF THE INVENTION

In one embodiment, a cable assembly is provided having a first header connector that includes a housing that holds a plurality of contacts. The housing of the first header connector has a first mating interface. The cable assembly also includes a second header connector having a housing that holds a plurality of contacts. The housing of the second header connector has a second mating interface facing in an opposite direction from the first mating interface. A cable bundle has a plurality of cables extending between the first and second header connectors. The cables are connected between corresponding contacts of the first header connector and the contacts of the second header connector.

In another embodiment, a connector system is provided having a chassis that has a framework of panels that define a plurality of cells that extend between first ends and second ends. Cable assemblies are received in corresponding cells. The cable assemblies each include a first header connector coupled to the framework at the first end of the corresponding cell and a second header connector is coupled to the framework at the second end of the corresponding cell. The first header connector has a housing that holds a plurality of contacts. The housing of the first header connector has a first mating interface. The second header connector has a housing that holds a plurality of contacts. The housing of the second header connector has a second mating interface that faces in an opposite direction from the first mating interface. A cable bundle has a plurality of cables that extend between the first and second header connectors. The cables are connected between corresponding contacts of the first header connector and the contacts of the second header connector.

In a further embodiment, a connector system is provided having a chassis that has a framework of panels that defines a plurality of cells extending between first ends and second ends. A clip is coupled to the framework within a corresponding cell. A cable assembly is received in a corresponding cell. The cable assembly includes a first header connector coupled to the framework at the first end of the corresponding cell using the clip and a second header connector is coupled to the framework at the second end of the corresponding cell using the clip. The first header connector has a housing that holds a plurality of contacts. The housing of the first header connector has a first mating interface. The second header connector has a housing that holds a plurality of contacts. The housing of the second header connector has a second mating interface that faces in an opposite direction from the first mating interface. A cable bundle has a plurality of cables that extends between the first and second header connectors. The cables are connected between corresponding contacts of the first header connector and the contacts of the second header connector.

DETAILED DESCRIPTION OF THE INVENTION

Figure 1:
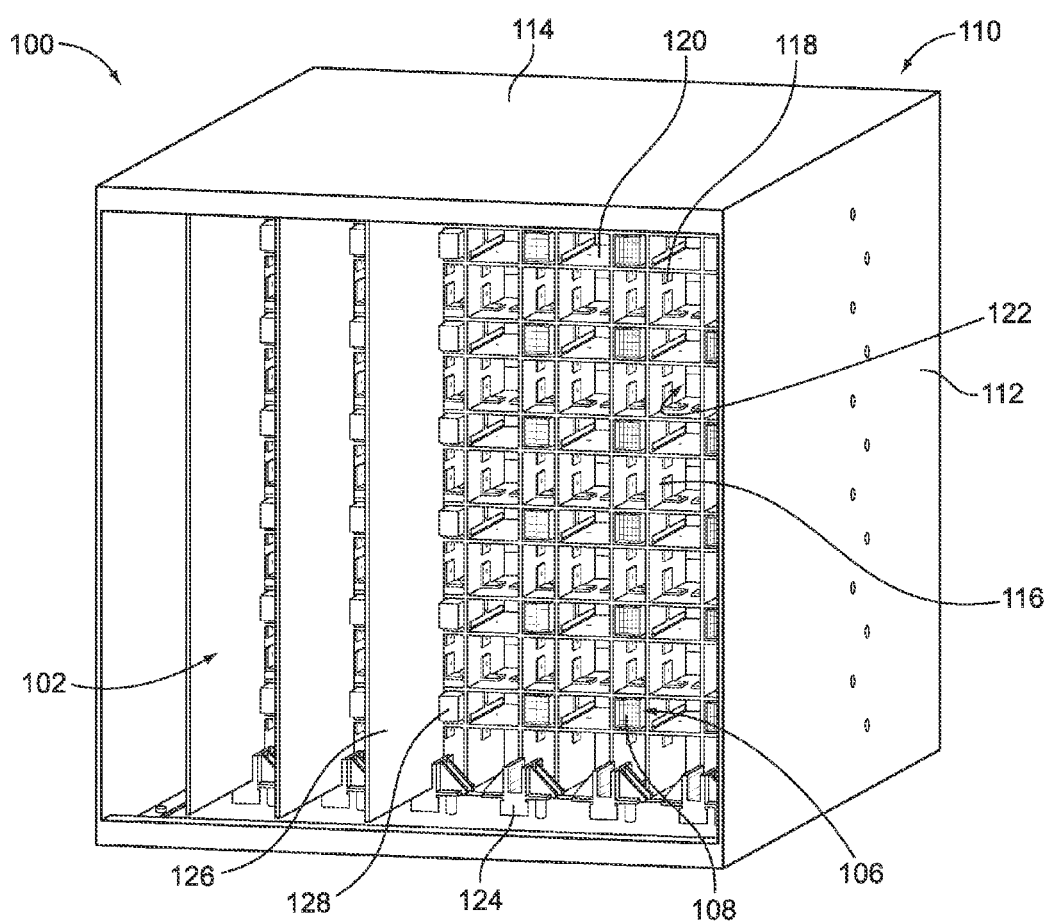
FIG. 1 is a front perspective view of a connector system formed in accordance with an exemplary embodiment.

FIG. 1 is a front perspective view of a connector system 100 formed in accordance with an exemplary embodiment. In an exemplary embodiment, the connector system 100 is utilized to connect a plurality of front cards 102 with a plurality of rear cards 104 (shown in FIG. 2). The front cards 102 may be line cards or server blade cards and the rear cards 104 may be switch cards or I/O cards. Other types of cards may be used in alternative embodiments. The connector system 100 may be arranged in different configurations to hold the front cards 102 and the rear cards 104 at different orientations. For example, in a first configuration, the front cards 102 may be oriented vertically and the rear cards 104 may be oriented horizontally. When the connector system 100 is set up in such a configuration, the connector system 100 defines an orthogonal connector system. In another configuration, the front cards 102 may be held horizontally and the rear cards 104 may also be held horizontally. In such a configuration, the connector system 100 defines a coplanar connector system. Alternatively, the front cards 102 and the rear cards 104 may both be oriented vertically, with the connector system 100 still defining a coplanar connector system.

The connector system 100 utilizes cable assemblies 106 having header connectors 108 interconnected by cables (not shown in FIG. 1) that are configured to mate with the front cards 102 and the rear cards 104. The cables allow the header connectors 108 to be oriented at different rotational positions with respect to one another, such as to define an orthogonal connector system or a coplanar connector system.

The cables allow the header connectors 108 to be rotated with respect to one another. For example, in one particular coplanar connector system, the header connectors 108 are oriented in non-rotated positions. The header connectors 108 on one side of the connector system 100 are not twisted or rotated with respect to the header connectors 108 on the other side of the connector system 100. In another coplanar connector system, the header connectors 108 on one side of the connector system 100 are oriented 180° with respect to the header connectors 108 on the other side of the connector system 100. Such a configuration defines an inverted coplanar connector system. In one particular orthogonal connector system, the header connectors 108 on one side of the connector system 100 are oriented 90° clockwise with respect to the header connectors 108 on the other side of the connector system 100. In another orthogonal connector system, the header connectors 108 are oriented 90° counterclockwise with respect to the header connectors 108 on the other side of the connector system 100. The same components and cable assemblies 106 are used to define the different configurations for the connector system 100, to change between the coplanar, inverted coplanar and orthogonal connector systems. As such, a robust connector system 100 is provided that may be configured in different ways depending on the end use desired by the customer.

The connector system 100 includes a chassis 110 for holding the front cards 102 and rear cards 104. The chassis 110 includes a cabinet 112 having a plurality of walls 114 that define a cabinet 112. A framework 116 is arranged within the cabinet 112, which may be coupled to the walls 114 to hold the framework 116 within the cabinet 112. The framework 116 includes a plurality of vertical panels 118 and a plurality of horizontal panels 120 that are arranged in a matrix to define a plurality of cells 122. The cable assemblies 106 are received within corresponding cells 122. A plurality of holders or card guides 124 are arranged within the cabinet 112 to hold the front cards 102 and rear cards 104.

Each front card 102 includes a circuit board 126 having a plurality of receptacle connectors 128 mounted to an edge thereof. The front card 102 is loaded into the cabinet 112 and guided into position by the holders 124. In the illustrated embodiment, the front card 102 is loaded into the cabinet 112 in a vertical orientation. In an alternative embodiment, the front card 102 may be loaded into the cabinet 112 in a horizontal orientation rather than a vertical orientation. The front card 102 is loaded into the cabinet 112 such that the receptacle connectors 128 mate with corresponding header connectors 108 of the cable assembly 106. In an exemplary embodiment, as described in further detail below, the header connectors 108 are allowed to float in one or more directions within the cells 122 to align the header connectors 108 with the receptacle connectors 128. The header connectors 108 within the same column may be moved in different directions to align with the receptacle connectors 128 of a particular front card 102. The header connectors 108 within a particular row may be moved in different directions to align with the receptacle connectors 128 of different front cards 102.

Figure 2:
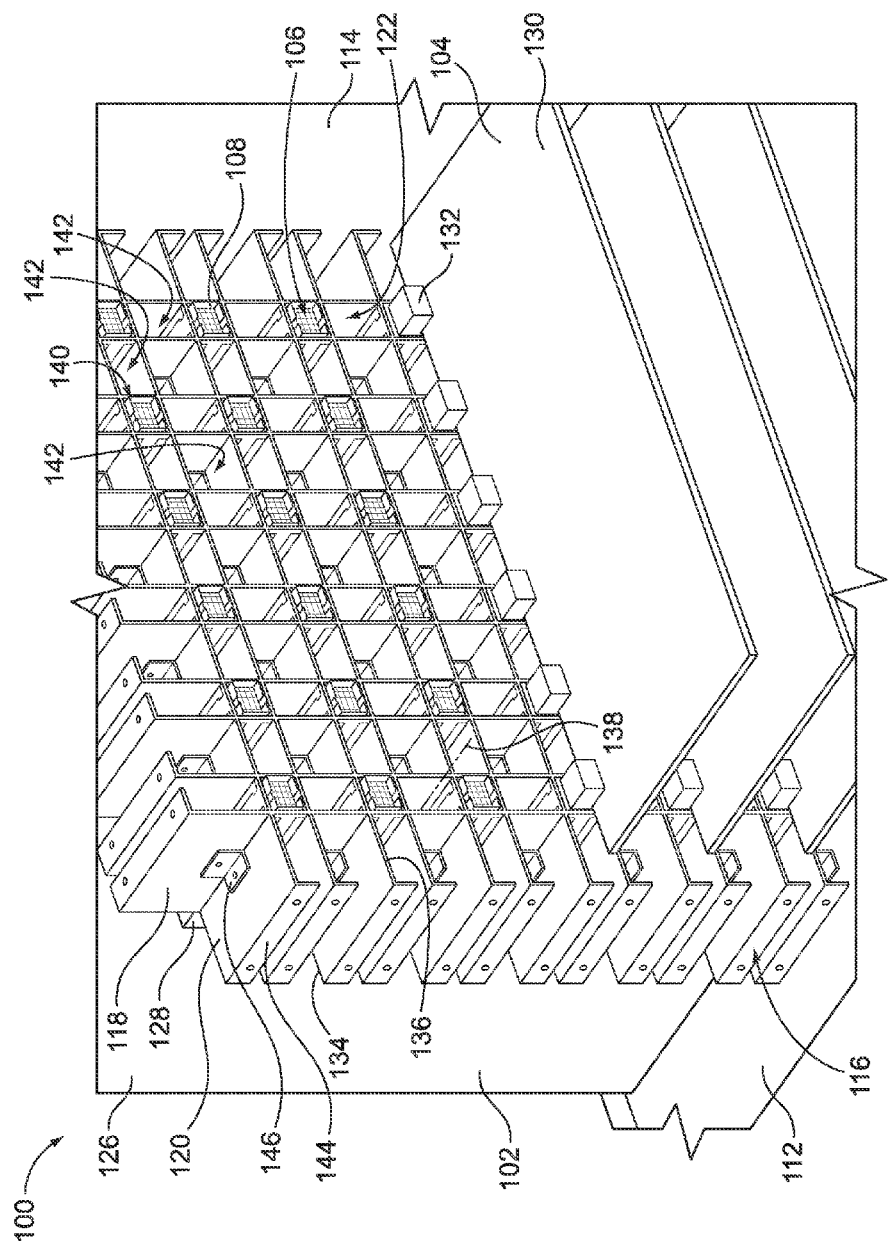
FIG. 2 is a rear perspective view of a portion of the connector system with a portion of a cabinet removed for clarity.

FIG. 2 is a rear perspective view of the connector system 100 with a portion of the cabinet 112 removed for clarity. FIG. 2 illustrates three of the rear cards 104 mated with the corresponding cable assemblies 106. The rear cards 104 are oriented in horizontal orientations, which is in contrast to the vertical orientations of the front cards 102. With the rear cards 104 oriented perpendicularly with respect to the front cards 102, the connector system 100 defines an orthogonal connector system. The rear cards 104 each include a circuit board 130 and a plurality of receptacle connectors 132 mounted to an edge of the circuit board 130. The rear cards 104 are loaded into the cabinet 112 such that the receptacle connectors 132 mate with corresponding header connectors 108 of the cable assemblies 106. In an exemplary embodiment, the header connectors 108 are able to float within the cells 122 such that the header connectors 108 may be aligned with the receptacle connectors 132 during mating.

In an exemplary embodiment, the cells 122 extend between a first end 134 and a second end 136. The cells 122 have cell axes 138 extending between the first and second ends 134, 136. The vertical and horizontal panels 118, 120 are oriented generally perpendicular with respect to one another such that the cells 122 have rectangular cross-sections along the cell axes 138. Optionally, the cells 122 may have different sizes, and the cells 122 may have different uses. In an exemplary embodiment, a first subset of the cells 122 defines connector cells 140 that are configured to receive the cable assemblies 106. Another subset of the cells 122 define airflow cells 142 extending between the first and second ends 134, 136.

The airflow cells 142 allow airflow through the framework 116 between the first and second ends 134, 136. The airflow cells 142 allow airflow along the cell axes 138. The airflow cells 142 allow airflow in a direction parallel to the circuit boards 126 of the front cards 102 as well as the circuit boards 130 of the rear cards 104. As such, air is allowed to flow into the cabinet 112, such as from the front of the cabinet 112, past the front cards 102, through the framework 116, past the rear cards 104 and out the rear of the cabinet 112. Air may flow in the opposite direction in alternative embodiments. The airflow cells 142 are provided adjacent to the connector cells 140. Having airflow along the connector cells 140 helps to reduce the temperature of the connector cells 140. Optionally, openings may be provided in the vertical panels 118 and/or the horizontal panels 120 between the airflow cells 142 and the connector cells 140 to allow cross-flow of air between the airflow cells 142 and the connector cells 140. The airflow through the framework 116 helps to reduce the temperature of the circuit boards 126 of the front cards 102 as well as the circuit boards 130 of the rear cards 104, as well as components on the circuit boards 126, 130, such as integrated circuits, power supplies or other components on the circuit boards 126, 130. Reducing the temperature of the header connectors 108 and the receptacle connectors 128, 132 may help the electrical performance of the connector system 100.

The vertical panels 118 and the horizontal panels 120 include flanges 144 that are used to couple the framework 116 to the walls 114 of the cabinet 112. The framework 116 may include brackets 146 for coupling the vertical panels 118 to the horizontal panels 120.

Figure 3:
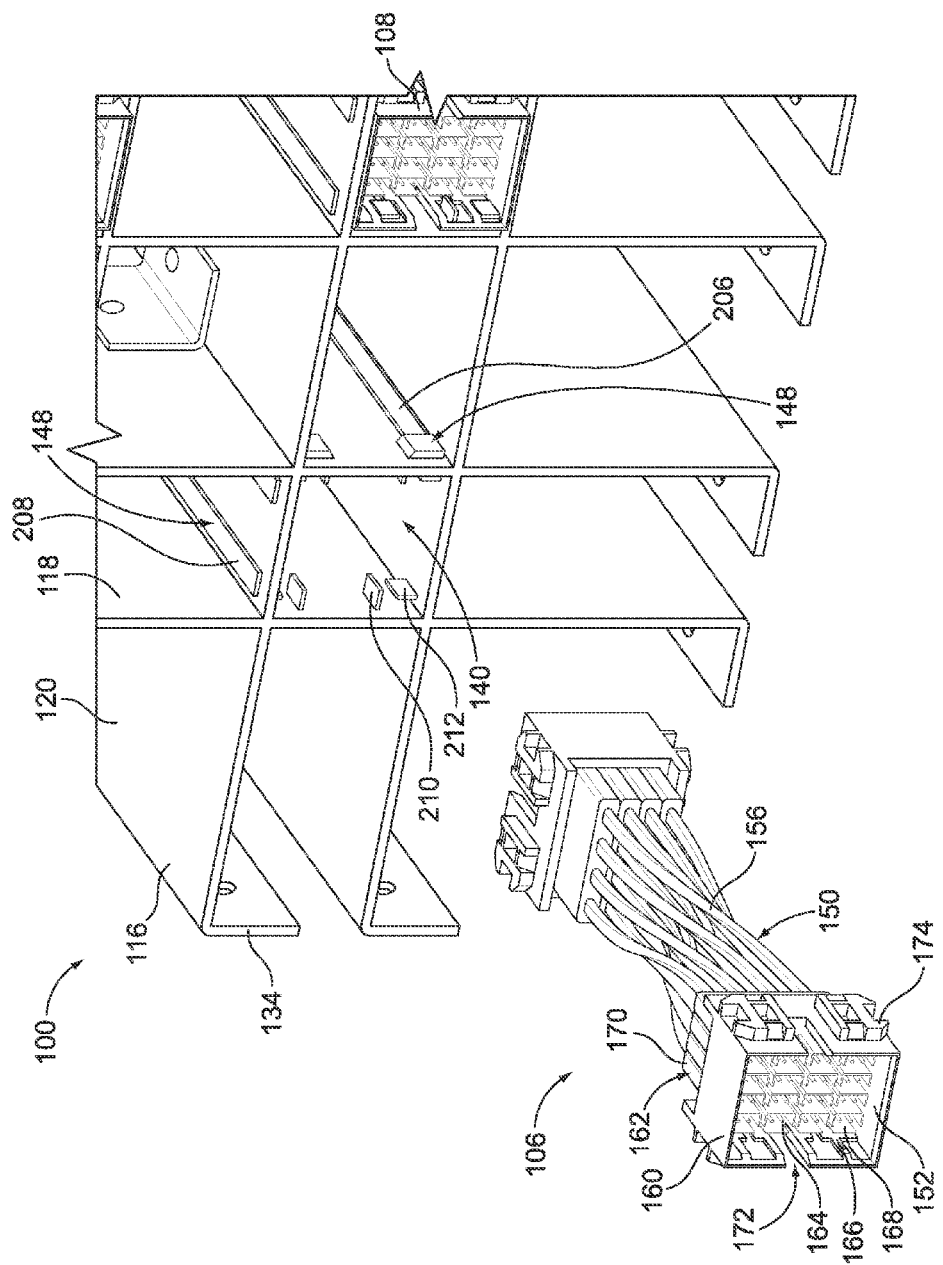
FIG. 3 is a front perspective view of the connector system showing a framework with one of the cable assemblies poised for loading into a corresponding cell of the framework.

FIG. 3 is a front perspective view of a portion of the connector system 100 showing a corner of the framework 116 with one of the cable assemblies 106 poised for loading into the corresponding connector cell 140 of the framework 116. The connector system 100 includes a plurality of clips 148 coupled to the vertical panels 118 and/or horizontal panels 120 of the framework 116 to hold the cable assemblies 106 within the corresponding connector cell 140. The clips 148 extend into the connector cell 140 and are configured to engage the header connectors 108 when the cable assembly 106 is loaded into the connector cell 140.

The cable assembly 106 includes a cable bundle 150 extending between the header connectors 108. In the illustrated embodiment, the header connectors 108 constitute a first header connector 152 and a second header connector 154. The first header connector 152 is configured to be arranged at the first end 134 of the connector cell 140. The second header connector 154 is configured to be arranged at the second end 136 (shown in FIG. 2) of the connector cell 140. The first header connector 152 is configured to be mated with a corresponding receptacle connector 128 (shown in FIG. 1) of the front card 102 (shown in FIG. 1). The second connector 154 is configured to be mated with a receptacle connector 132 (shown in FIG. 2) of the rear card 104 (shown in FIG. 2). In an exemplary embodiment, the first and second header connectors 152, 154 are identical to one another. Alternatively, the first and second header connectors 152, 154 may be different from one another, such as by having different mating interfaces.

The cable bundle 150 extends between the first and second header connectors 152, 154. The cable bundle 150 has a plurality of cables 156 that are terminated at one end to the first header connector 152 and at another end to the second header connector 154. The cables 156 are relatively short, such as approximately 2-3 times the length of the first and second header connectors 152, 154. The cables 156 are shorter than the length of the framework 116. In an exemplary embodiment, the cables 156 constitute twin axial cables having a pair of center conductors that are held within a common jacket. Other types of cables may be used in alternative embodiments.

In an exemplary embodiment, the first header connector 152 and the second header connector 154 are cable mounted versions of STRADA Whisper backplane connectors, commercially available from Tyco Electronics. The first header connector 152 and the second header connector 154 may be cable mounted versions of Z-Pack TinMan backplane connectors, commercially available from Tyco Electronics, in an alternative embodiment. The first header connector 152 and the second header connector 154 may have other types of mating interfaces in other alternative embodiments. The first header connector 152 and the second header connector 154 face in opposite directions. The first and second header connectors 152, 154 are oriented perpendicular with respect to one another. The second header connector 154 is rotated 90° with respect to the first header connector 152. The cable bundle 150 is twisted between the first and second header connectors 152, 154.

The first header connector 152 includes a housing 160 holding a plurality of contact modules 162. Each contact module 162 includes a plurality of signal contacts 164. The housing 160 includes a receiving space 166 at a front of the housing 160 that is configured to receive a portion of the receptacle connector 128. The signal contacts 164 extend into the receiving space 166 and are configured to be mated with corresponding receptacle contacts (not shown) of the receptacle connectors 128. In the illustrated embodiment, the signal contacts 164 constitute pin contacts that are configured to be received in socket contacts of the receptacle connector 128. Other types of signal contacts may be provided in alternative embodiments.

The signal contacts 164 are arranged in pairs and are configured to carry differential pair signals. The signal contacts 164 within each differential pair are held within a common contact module 162. In the illustrated embodiment, each contact module 162 holds four differential pairs of signal contacts 164. The contact modules 162 may hold more or less than four differential pairs of signal contacts 164 in alternative embodiments. In other embodiments, the signal contacts 164 may be single ended rather than a part of differential pairs.

Ground contacts 168 are provided between the pair of signals contacts 164. In the illustrated embodiment, the ground contacts 168 generally form a box around the differential pairs of signal contacts 164, and provide shielding between adjacent pairs of signal contacts 164. Alternatively, the ground contacts 168 may be pins similar to the signal contacts 164 rather than forming a box around the signal contacts 164. In an exemplary embodiment, the ground contacts 168 form part of the contact modules 162 and may be terminated to ground conductors within the cables 156.

In an exemplary embodiment, the signal contacts 164 and/or the ground contacts 168 form part of a lead frame that is overmolded by a contact module body 170 to form the contact module 162. The contact module body 170 may be manufactured from a dielectric material, such as a plastic material, that is overmolded over the lead frame. The contact module body 170 may be formed by another process other than overmolding in alternative embodiments. In an exemplary embodiment, during the overmolding process, the ends of the cables 156 are overmolded within the contact module body 170 to secure the cables 156 to the contact modules 162. The center conductors of the cables 156 may be terminated to the signal contacts 164 and/or the ground contacts 168 prior to the overmolding process. The contact module bodies 170 are held within the housing 160 to secure the signal contacts 164 and/or the ground contacts 168 within the housing 160.

The housing 160 includes alignment features 172 for aligning the first header connector 152 with the receptacle connector 128 during mating. In the illustrated embodiment, the alignment features 172 constitute slots formed in the sides of the housing 160 that receive projections extending from the receptacle connector 128. Other types of alignment features 172 may be used in alternative embodiments to align the first header connector 152 with the receptacle connector 128 during mating.

The housing 160 includes a plurality of tabs 174 on an exterior of the housing 160. The tabs 174 engage the clips 148 to hold the first header connector 152 within the connector cell 140. In an exemplary embodiment, the housing 160 has a square shape and the connector cell 140 has a complementary square shape, which allows the housing 160 to be positioned at any orthogonal position within the connector cell 140. For example, the housing 160 may be rotated at 90°, 180° or 270° and still fit within the connector cell 140.

Optionally, the cables 156 may be pretwisted. For example, the cables 156 may have approximately 90° of twist between the ends of the cables 156. Alternatively, the cables 156 may have approximately 180° of twist between the ends of the cables 156. The pretwisting may help to orient the first header connector 152 with respect to the second header connector 154, such as at 90° or at 180° with respect to one another.

Figure 4:
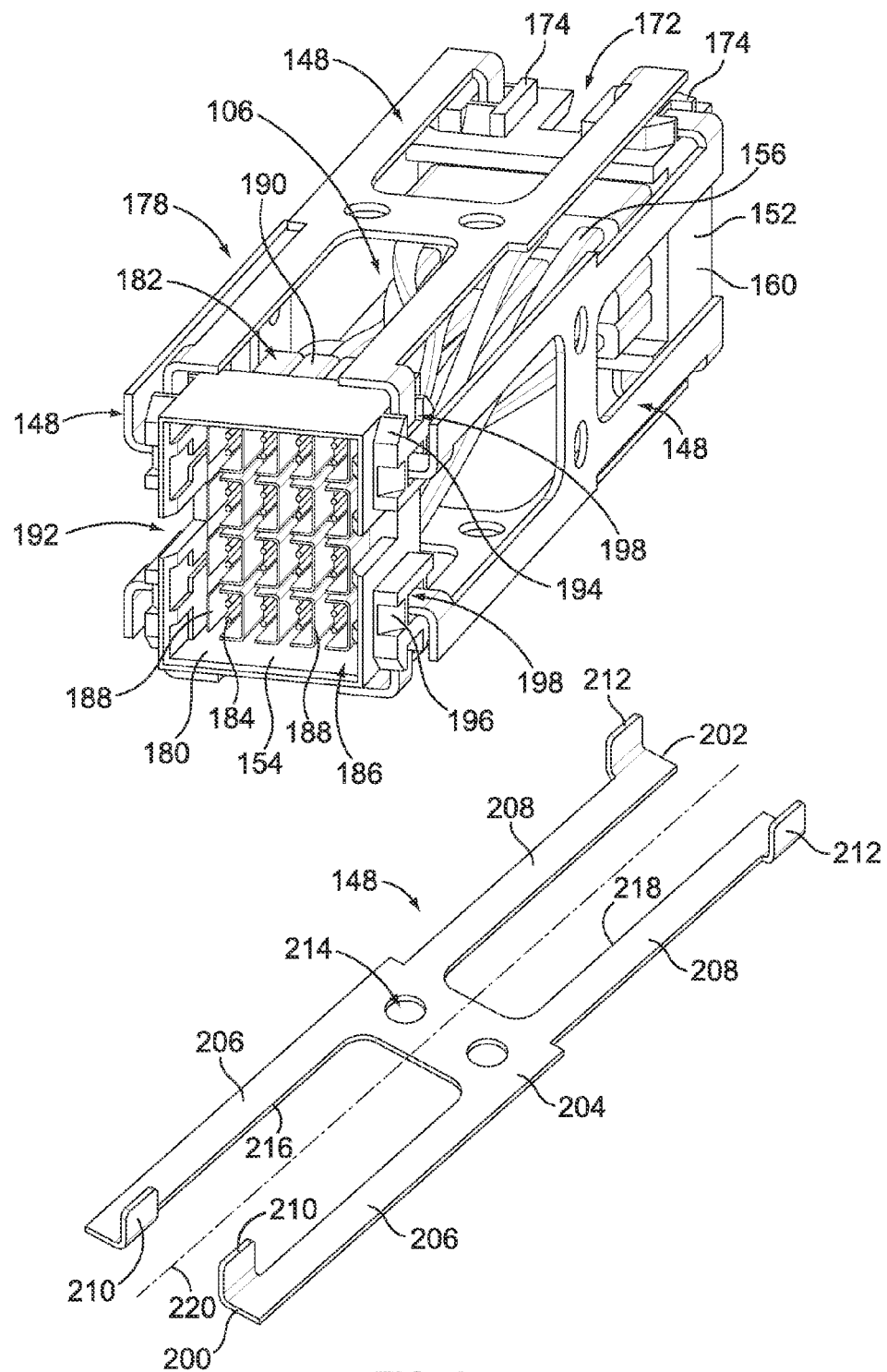
FIG. 4 is a rear perspective view of one of the cable assemblies showing a mating interface of a second header connector thereof.

FIG. 4 is a rear perspective view of the cable assembly 106 showing a mating interface of the second header connector 154. The cable assembly 106 is held within a cage 178 defined by a plurality of the clips 148. The cage 178 holds the tops, bottoms and opposite sides of the first and second header connectors 152, 154. In the illustrated embodiment, the cage 178 is defined by four clips 148 arranged at the top, bottom and opposite sides of the cable assembly 106. More or less clips 148 may be used in alternative embodiments to hold the cable assembly 106.

The second header connector 154 includes a housing 180 holding a plurality of contact modules 182. Each contact module 182 includes a plurality of signal contacts 184. The housing 180 includes a receiving space 186 at a front of the housing 180 that is configured to receive a portion of the receptacle connector 132. The signal contacts 184 extend into the receiving space 186 and are configured to be mated with corresponding receptacle contacts (not shown) of the receptacle connectors 132. In the illustrated embodiment, the signal contacts 184 constitute pin contacts that are configured to be received in socket contacts of the receptacle connector 132. Other types of signal contacts may be provided in alternative embodiments.

The signal contacts 184 are arranged in pairs and are configured to carry differential pair signals. The signal contacts 184 within each differential pair are held within a common contact module 182. In the illustrated embodiment, each contact module 182 holds four differential pairs of signal contacts 184. The contact modules 182 may hold more or less than four differential pairs of signal contacts 184 in alternative embodiments. In other embodiments, the signal contacts 184 may be single ended rather than a part of differential pairs.

Ground contacts 188 are provided between the pair of signals contacts 184. In the illustrated embodiment, the ground contacts 188 generally form a box around the differential pairs of signal contacts 184, and provide shielding between adjacent pairs of signal contacts 184. Alternatively, the ground contacts 188 may be pins similar to the signal contacts 184 rather than forming a box around the signal contacts 184. In an exemplary embodiment, the ground contacts 188 form part of the contact modules 182 and may be terminated to ground conductors within the cables 156.

In an exemplary embodiment, the signal contacts 184 and/or the ground contacts 188 form part of a lead frame that is overmolded by a contact module body 190 to form the contact module 182. The contact module body 190 may be manufactured from a dielectric material, such as a plastic material, that is overmolded over the lead frame. The contact module body 190 may be formed by another process other than overmolding in alternative embodiments. In an exemplary embodiment, during the overmolding process, the ends of the cables 156 are overmolded within the contact module body 190 to secure the cables 156 to the contact modules 182. The center conductors of the cables 156 may be terminated to the signal contacts 184 and/or the ground contacts 188 prior to the overmolding process. The contact module bodies 190 are held within the housing 180 to secure the signal contacts 184 and/or the ground contacts 188 within the housing 180.

The housing 180 includes alignment features 192 for aligning the second header connector 154 with the receptacle connector 132 during mating. In the illustrated embodiment, the alignment features 192 constitute slots formed in the sides of the housing 180 that receive projections extending from the receptacle connector 132. Other types of alignment features 192 may be used in alternative embodiments to align the second header connector 154 with the receptacle connector 132 during mating. The housing 180 is oriented at 90° with respect to the housing 160 such that the alignment features 192 are oriented at east-west positions, while the alignment features 172 of the housing 160 are oriented at north-south positions.

The housing 180 includes a plurality of tabs 194 on an exterior of the housing 180. The tabs 194 engage the clips 148 to hold the first header connector 152 within the connector cell 140. The housing 180 is oriented at 90° with respect to the housing 160 such that the tabs 194 are oriented at east-west positions, while the tabs 174 of the housing 160 are oriented at north-south positions. The tabs 194 include ramped surfaces 196 that lead to pockets 198 that receive the clips 148. The clips 148 ride up the ramp surfaces and are captured in the pockets 198 to hold the position of the housing 180 with respect to the clip 148. Some of the pockets 198 are interior pockets that open inward, while other pockets 198 are exterior pockets that open outward. The interior pockets receive the clips 148 along the sides of the cage 178, while the exterior pockets receive clips 148 along the top and bottom of the cage 178.

Each clip 148 extends between a first end 200 and a second end 202. The clip 148 includes a base 204 having a pair of arms 206 extending between the base 204 and the first end 200 and another pair of arms 208 extending between the base 204 and the second end 202. Fingers 210 extend from the arms 206 and fingers 212 extend from the arms 208. The fingers 210 are provided along inside surfaces 216 of the arms 206. The fingers 212 are provided along outside surfaces 218 of the arms 208. The fingers 210 are positioned closer to a central longitudinal axis 220 of the clip 148 than the fingers 212. The base 204 includes openings 214 that are configured to receive fasteners to secure the clip 148 to the vertical panel 118 or the horizontal panel 120 (both shown in FIG. 1).

In an exemplary embodiment, the arms 206 are cantilevered from the base 204 and may be deflected in one or more directions, such as during mating with the first header connector 152 and/or second header connector 154. Similarly, the arms 208 are cantilevered from the base 204 and may be deflected, such as during mating with the first header connector 152 and/or second header connector 154. The arms 206, 208 may also be deflected when holding the first header connector 152 or the second header connector 154. Such deflection allows the first header connector 152 or the second header connector 154 to float within the connector cell 140. During mating with the receptacle connectors 128, 132, the first header connector 152 or the second header connector 154 may be shifted within the connector cell 140 in one or more directions to properly align the first header connector 152 or second header connector 154 with respect to the receptacle connector 128 or the receptacle connector 132, respectively. The arms 206, 208 function as spring arms that allow such movement of the first header connector 152 or the second header connector 154.

Returning to FIG. 3, the clips 148 are coupled to the vertical panels 118 and horizontal panels 120 such that the arms 206, 208 are outside of the connector cell 140 that receives the cable assembly 106. The fingers 210, 212 extend through openings in the vertical and horizontal panels 118, 120 such that the fingers 210, 212 extend into the connector cell 140 that receives the cable assembly 106. The clips 148 are coupled to the vertical panels 118 such that the arms 206 extend to the first end 134 of the connector cell 140. The clips 148 are coupled to the horizontal panels 120 such that the arms 208 extend to the second end 136 of the connector cell 140. As such, the clips 148 on the vertical panels 118 are oriented 180° with respect to the clips 148 on the horizontal panels 120. The fingers 210, 212 are configured to engage the first header connector 152 to hold the first header connector 152 at the first end 134. Similarly, the fingers 210, 212 are configured to engage the second header connector 154 to hold the second header connector 154 at the second end 136.

Figure 5:
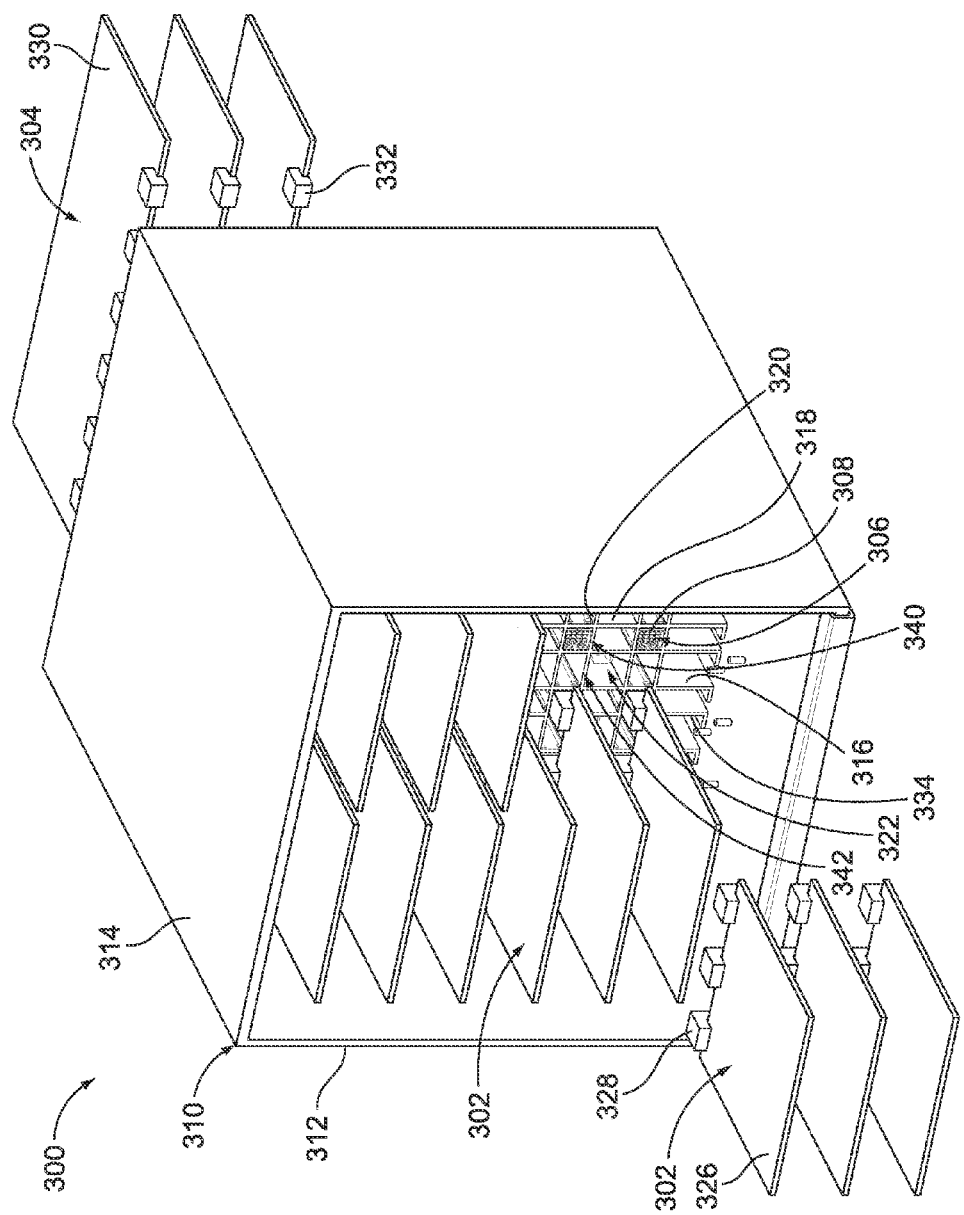
FIG. 5 is a front perspective view of an alternative connector system formed in accordance with an exemplary embodiment.

FIG. 5 is a front perspective view of an alternative connector system 300 formed in accordance with an exemplary embodiment. The connector system 300 represents a coplanar connector system. The connector system is utilized to connect a plurality of front cards 302 with a plurality of rear cards 304. The front cards 302 are held horizontally and the rear cards 304 are also held horizontally to define the coplanar connector system. Alternatively, the front cards 302 and the rear cards 304 may both be oriented vertically, with the connector system 300 still defining a coplanar connector system.

The connector system 300 utilizes cable assemblies 306 having header connectors 308 interconnected by cables (not shown in FIG. 3) that are configured to mate with the front cards 302 and the rear cards 304. The cable assemblies 306 may be identical to the cable assemblies 106 (shown in FIG. 1), however the header connectors 308 and cables are not twisted to an orthogonal configuration as were the header connectors 108 (shown in FIGS. 1 and 2) and cables 156 (shown in FIG. 3).

The connector system 300 includes a chassis 310 for holding the front cards 302 and rear cards 304. The chassis 310 includes a cabinet 312 having a plurality of walls 314 that define a cabinet 312. The cabinet 312 may be identical to the cabinet 112 (shown in FIG. 1). A framework 316 is arranged within the cabinet 312, which may be coupled to the walls 314 to hold the framework 316 within the cabinet 312. The framework 316 may be identical to the framework 116 (shown in FIG. 1). The framework 316 includes a plurality of vertical panels 318 and a plurality of horizontal panels 320 that are arranged in a matrix to define a plurality of cells 322. The cable assemblies 306 are received within corresponding cells 322.

Each front card 302 includes a circuit board 326 having a plurality of receptacle connectors 328 mounted to an edge thereof. In the illustrated embodiment, the front cards 302 each include three receptacle connectors 328. Two front cards are aligned with one another in each row and mated with the cable assemblies 306. The header connectors 308 are allowed to float in one or more directions within the cells 322 to align the header connectors 308 with the receptacle connectors 328.

FIG. 5 illustrates three of the rear cards 304 poised for loading into the cabinet 312. The rear cards 304 are oriented in horizontal orientations. The rear cards 304 each include a circuit board 330 and a plurality of receptacle connectors 332 mounted to an edge of the circuit board 330. The rear cards 304 are loaded into the cabinet 312 such that the receptacle connectors 332 mate with corresponding header connectors 308 of the cable assemblies 306. In an exemplary embodiment, the header connectors 308 are able to float within the cells 322 such that the header connectors 308 may be aligned with the receptacle connectors 332 during mating.

In an exemplary embodiment, a first subset of the cells 322 defines connector cells 340 that are configured to receive the cable assemblies 306. Another subset of the cells 322 define airflow cells 342 extending between a first end 334 and a second end (not shown). The airflow cells 342 allow airflow through the framework 316. Air is allowed to flow into the cabinet 312 through the framework 316. The airflow through the framework 316 helps to reduce the temperature of the circuit boards 326, 328 and/or components on the circuit boards 326, 328 of the front cards 302 and the rear cards 304, respectively.

Figure 6:
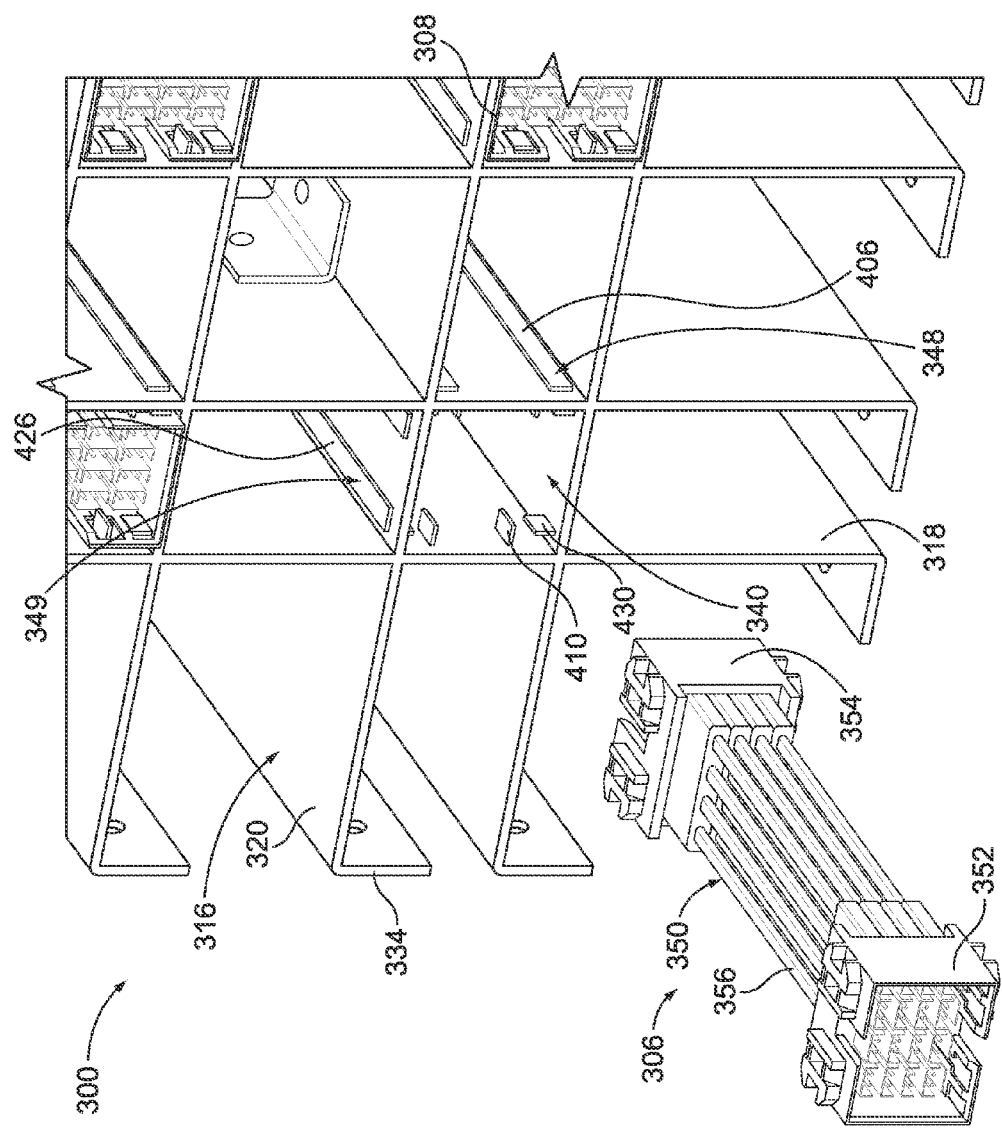
FIG. 6 is a front perspective view of a portion of the connector system shown in FIG. 5 showing a cable assembly poised for loading into a cell of a framework of the connector system.

FIG. 6 is a front perspective view of a portion of the connector system 300 showing a corner of the framework 316 with one of the cable assemblies 306 poised for loading into the corresponding connector cell 340 of the framework 316.

The connector system 300 includes a plurality of clips 348, 349 coupled to the vertical panels 318 and horizontal panels 320, respectively, of the framework 316 to hold the cable assemblies 306 within the corresponding connector cell 340. The clips 348, 349 extend into the connector cell 340 and are configured to engage the header connectors 308 when the cable assembly 306 is loaded into the connector cell 340.

The cable assembly 306 includes a cable bundle 350 extending between the header connectors 308. In the illustrated embodiment, the header connectors 308 constitute a first header connector 352 and a second header connector 354. The first header connector 352 is configured to be arranged at a first end 334 of the framework 316. The second header connector 354 is configured to be arranged at an opposite end of the framework 316. In an exemplary embodiment, the first and second header connectors 352, 354 are identical to one another. Alternatively, the first and second header connectors 352, 354 may be different from one another, such as by having different mating interfaces. The first header connector 352 and the second header connector 354 face in opposite directions. The first and second header connectors 352, 354 are coplanar with respect to one another. The second header connector 354 is not rotated with respect to the first header connector 352, or in other words is at a 0° position with respect to the first header connector 352.

The cable bundle 350 extends between the first and second header connectors 352, 354. The cable bundle 350 has a plurality of cables 356 that are terminated at one end to the first header connector 352 and at another end to the second header connector 354. The cables 356 are relatively short and extend along linear paths between the first and second header connectors 352, 354. In an exemplary embodiment, the cables 356 constitute twin axial cables having a pair of center conductors that are held within a common jacket. Other types of cables may be used in alternative embodiments.

Figure 7:
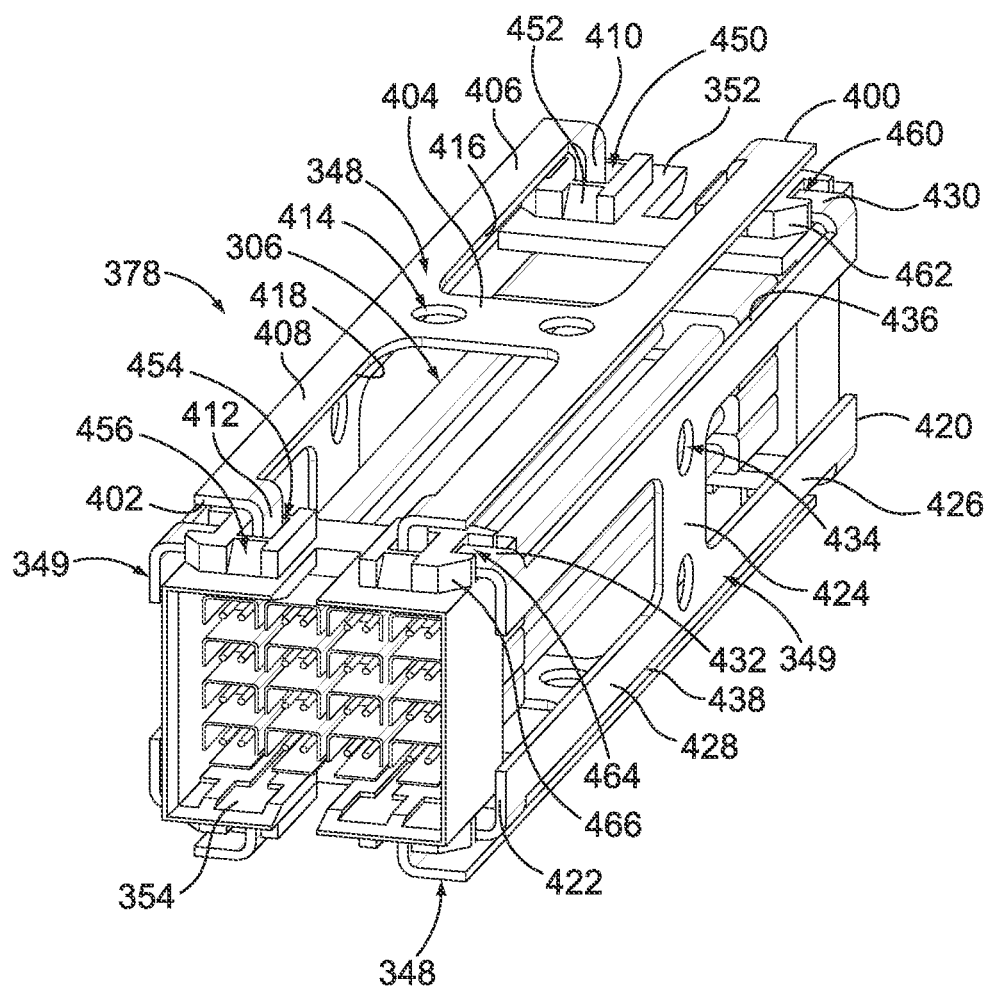
FIG. 7 is a rear perspective view of the cable assembly shown in FIG. 6.

FIG. 7 is a rear perspective view of the cable assembly 306 showing a mating interface of the second header connector 354. The cable assembly 306 is held within a cage 378 defined by a pair of the clips 348 on the sides of the cable assembly 306 and a pair of the clips 349 on the top and bottom of the cable assembly 306. The cage 378 holds the tops, bottoms and opposite sides of the first and second header connectors 352, 354.

Each clip 348 extends between a first end 400 and a second end 402. The clip 348 includes a base 404 having a pair of arms 406 extending between the base 404 and the first end 400 and another pair of arms 408 extending between the base 404 and the second end 402. The arms 406, 408 are cantilevered from the base 404 and may be deflected in one or more directions. Such deflection allows the first header connector 352 or the second header connector 354 to float within the connector cell 340. The arms 406, 408 function as spring arms that allow such movement of the first header connector 352 or the second header connector 354. Fingers 410 extend from the arms 406 and fingers 412 extend from the arms 408. The fingers 410 are provided along inside surfaces 416 of the arms 406. The fingers 412 are provided along inside surfaces 418 of the arms 408. The base 404 includes openings 414 that are configured to receive fasteners to secure the clip 348 to the vertical panel 318 (shown in FIG. 6).

Each clip 349 extends between a first end 420 and a second end 422. The clip 349 includes a base 424 having a pair of arms 426 extending between the base 424 and the first end 420 and another pair of arms 428 extending between the base 424 and the second end 422. The arms 426, 428 are cantilevered from the base 424 and may be deflected in one or more directions. Such deflection allows the first header connector 352 or the second header connector 354 to float within the connector cell 340. The arms 426, 428 function as spring arms that allow such movement of the first header connector 352 or the second header connector 354. Fingers 430 extend from the arms 426 and fingers 432 extend from the arms 428. The fingers 430 are provided along outside surfaces 436 of the arms 426. The fingers 432 are provided along outside surfaces 438 of the arms 428. The base 424 includes openings 434 that are configured to receive fasteners to secure the clip 348 to the horizontal panel 320 (shown in FIG. 6).

The fingers 410 are configured to engage the first header connector 352 to hold the first header connector 352 at the first end 334. For example, the fingers 410 are received in pockets 450 defined by tabs 452 of the first header connector 352. Similarly, the fingers 412 are configured to engage the second header connector 354 to hold the second header connector 354 at the second end 336. For example, the fingers 412 are received in pockets 454 defined by tabs 456 of the second header connector 352.

The clips 349 are coupled to the vertical panels 318 such that the arms 426, 428 are outside of the connector cell 340 that receives the cable assembly 306. The fingers 430, 432 extend through openings in the vertical and horizontal panels 318, 320 such that the fingers 430, 432 extend into the connector cell 340 that receives the cable assembly 306. The fingers 430 are configured to engage the first header connector 352 to hold the first header connector 352 at the first end 334. For example, the fingers 430 are received in pockets 460 defined by tabs 462 of the first header connector 352. Similarly, the fingers 432 are configured to engage the second header connector 354 to hold the second header connector 354 at the second end 336. For example, the fingers 432 are received in pockets 464 defined by tabs 466 of the second header connector 354.

Returning to FIG. 6, the clips 348 are coupled to the vertical panels 318 such that the arms 406, 408 are outside of the connector cell 340 that receives the cable assembly 306. The fingers 410, 412 (shown in FIG. 7) extend through openings in the vertical panels 318 such that the fingers 410, 412 extend into the connector cell 340 that receives the cable assembly 306. The fingers 430, 432 (shown in FIG. 7) extend through openings in the horizontal panels 320 such that the fingers 430, 432 extend into the connector cell 340 that receives the cable assembly 306.

Figure 8:
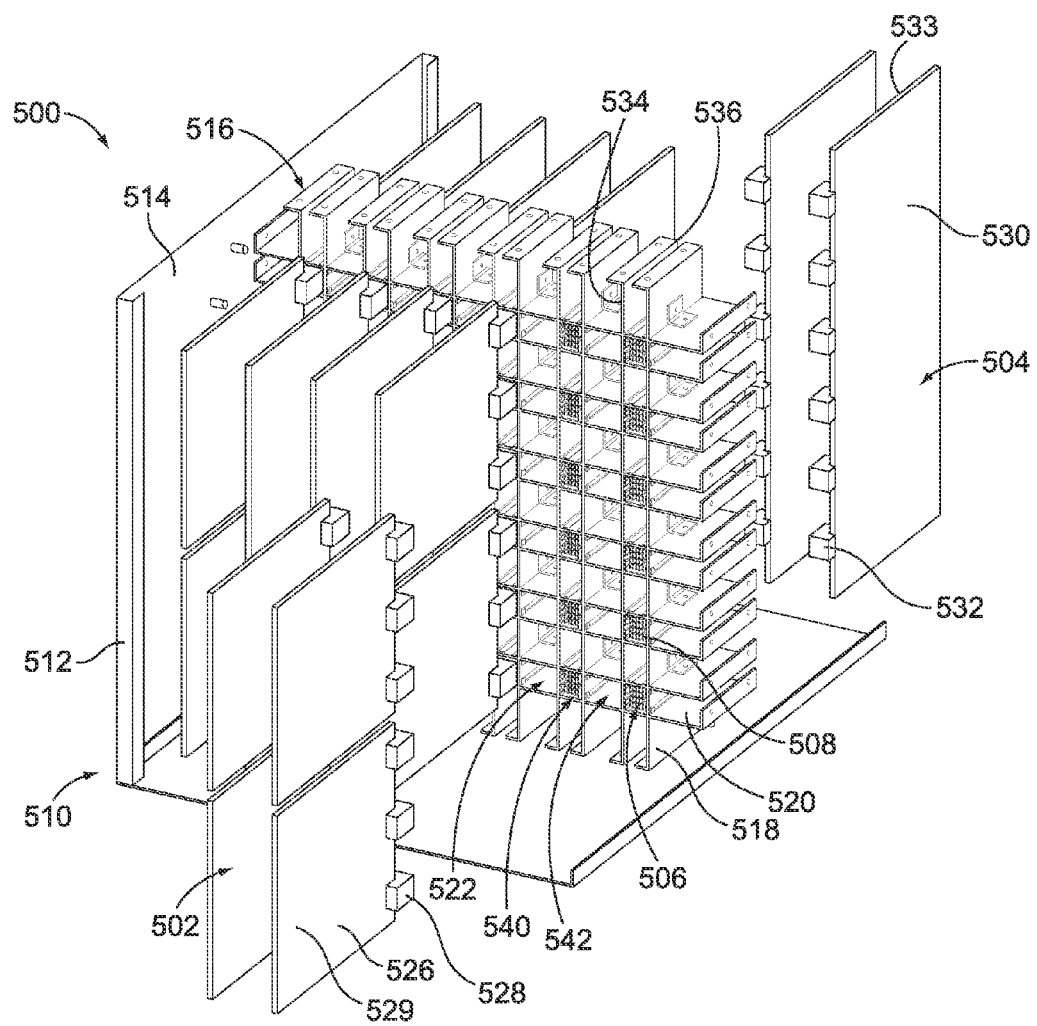
FIG. 8 is a front perspective view of an alternative connector system formed in accordance with an exemplary embodiment.

FIG. 8 is a front perspective view of an alternative connector system 500 formed in accordance with an exemplary embodiment. The connector system 500 represents an inverted coplanar connector system. The connector system is utilized to connect a plurality of front cards 502 with a plurality of rear cards 504. The front cards 502 are held vertically and the rear cards 504 are also held vertically to define the inverted coplanar connector system. Alternatively, the front cards 502 and the rear cards 504 may both be oriented horizontally, with the connector system 500 still defining an inverted coplanar connector system.

The connector system 500 utilizes cable assemblies 506 having header connectors 508 interconnected by cables (not shown in FIG. 8) that are configured to mate with the front cards 502 and the rear cards 504. The cable assemblies 506 may be identical to the cable assemblies 106 (shown in FIG. 1), however the header connectors 508 and cables are not twisted to an orthogonal configuration as were the header connectors 108 (shown in FIGS. 1 and 2) and cables 156 (shown in FIG. 3).

The connector system 500 includes a chassis 510 for holding the front cards 502 and rear cards 504. The chassis 510 includes a cabinet 512 having a plurality of walls 514 that define a cabinet 512. The cabinet 512 may be identical to the cabinet 112 (shown in FIG. 1). A framework 516 is arranged within the cabinet 512, which may be coupled to the walls 514 to hold the framework 516 within the cabinet 512. The framework 516 may be identical to the framework 316 (shown in FIGS. 5 and 6). The framework 516 includes a plurality of vertical panels 518 and a plurality of horizontal panels 520 that are arranged in a matrix to define a plurality of cells 522. The cable assemblies 506 are received within corresponding cells 522.

Each front card 502 includes a circuit board 526 having a plurality of receptacle connectors 528 mounted to an edge thereof. The receptacle connectors 528 generally extend from a mounting side 529 of the circuit board 526. The header connectors 508 are allowed to float in one or more directions within the cells 522 to align the header connectors 508 with the receptacle connectors 528.

The rear cards 504 each include a circuit board 530 and a plurality of receptacle connectors 532 mounted to an edge of the circuit board 530. The receptacle connectors 532 generally extend from a mounting side 533 of the circuit board 530. The rear cards 504 are loaded into the cabinet 512 such that the mounting sides 533 face in opposite directions as compared to the mounting sides 529 of the circuit boards 526. The rear cards 504 are loaded into the cabinet 512 such that the receptacle connectors 532 mate with corresponding header connectors 508 of the cable assemblies 506. In an exemplary embodiment, the header connectors 508 are able to float within the cells 522 such that the header connectors 508 may be aligned with the receptacle connectors 532 during mating.

In an exemplary embodiment, a first subset of the cells 522 defines connector cells 540 that are configured to receive the cable assemblies 506. Another subset of the cells 522 define airflow cells 542 extending between first and second ends 534, 536. The airflow cells 542 allow airflow through the framework 516. Air is allowed to flow into the cabinet 512 through the framework 516. The airflow through the framework 516 helps to reduce the temperature of the header connectors 508 as well as the receptacle connectors 528, 532. Reducing the temperature of the header connectors 508 and the receptacle connectors 528, 532 may help the electrical performance of the connector system 500.

Figure 9:
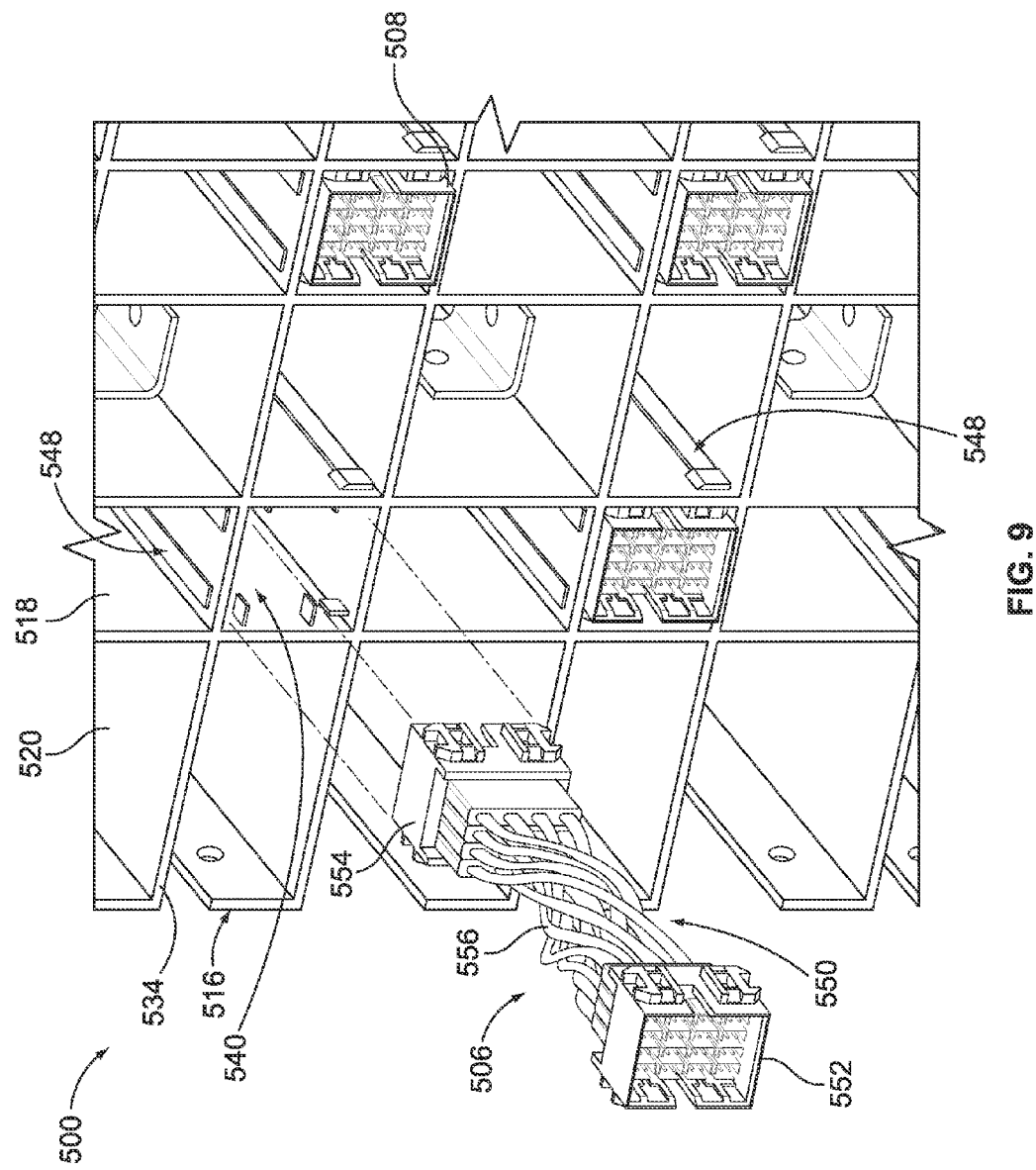
FIG. 9 is a front perspective view of a portion of the connector system shown in FIG. 8 showing a cable assembly poised for loading into a cell of a framework of the connector system.

FIG. 9 is a front perspective view of a portion of the connector system 500 showing a portion of the framework 516 with one of the cable assemblies 506 poised for loading into the corresponding connector cell 540 of the framework 516. The connector system 500 includes a plurality of clips 548 coupled to the vertical panels 518 and horizontal panels 520, respectively, of the framework 516 to hold the cable assemblies 506 within the corresponding connector cell 540. The clips 548 may be identical to the clips 348 (shown in FIG. 7). The clips 548 extend into the connector cell 540 and are configured to engage the header connectors 508 when the cable assembly 506 is loaded into the connector cell 540.

The cable assembly 506 includes a cable bundle 550 extending between the header connectors 508. In the illustrated embodiment, the header connectors 508 constitute a first header connector 552 and a second header connector 554. The first header connector 552 is configured to be arranged at a first end 534 of the framework 516. The second header connector 554 is configured to be arranged at an opposite end of the framework 516. In an exemplary embodiment, the first and second header connectors 552, 554 are identical to one another. Alternatively, the first and second header connectors 552, 554 may be different from one another, such as by having different mating interfaces. The first header connector 552 and the second header connector 554 face in opposite directions. The second header connector 554 is rotated approximately 180° with respect to the first header connector 552 to an inverted position.

The cable bundle 550 extends between the first and second header connectors 552, 554. The cable bundle 550 has a plurality of cables 556 that are terminated at one end to the first header connector 552 and at another end to the second header connector 554. The cables 556 are relatively short and extend along twisted paths between the first and second header connectors 552, 554. The cables are twisted approximately 180° between the first and second header connectors 552, 554. In an exemplary embodiment, the cables 556 constitute twin axial cables having a pair of center conductors that are held within a common jacket. Other types of cables may be used in alternative embodiments.

Figure 10:
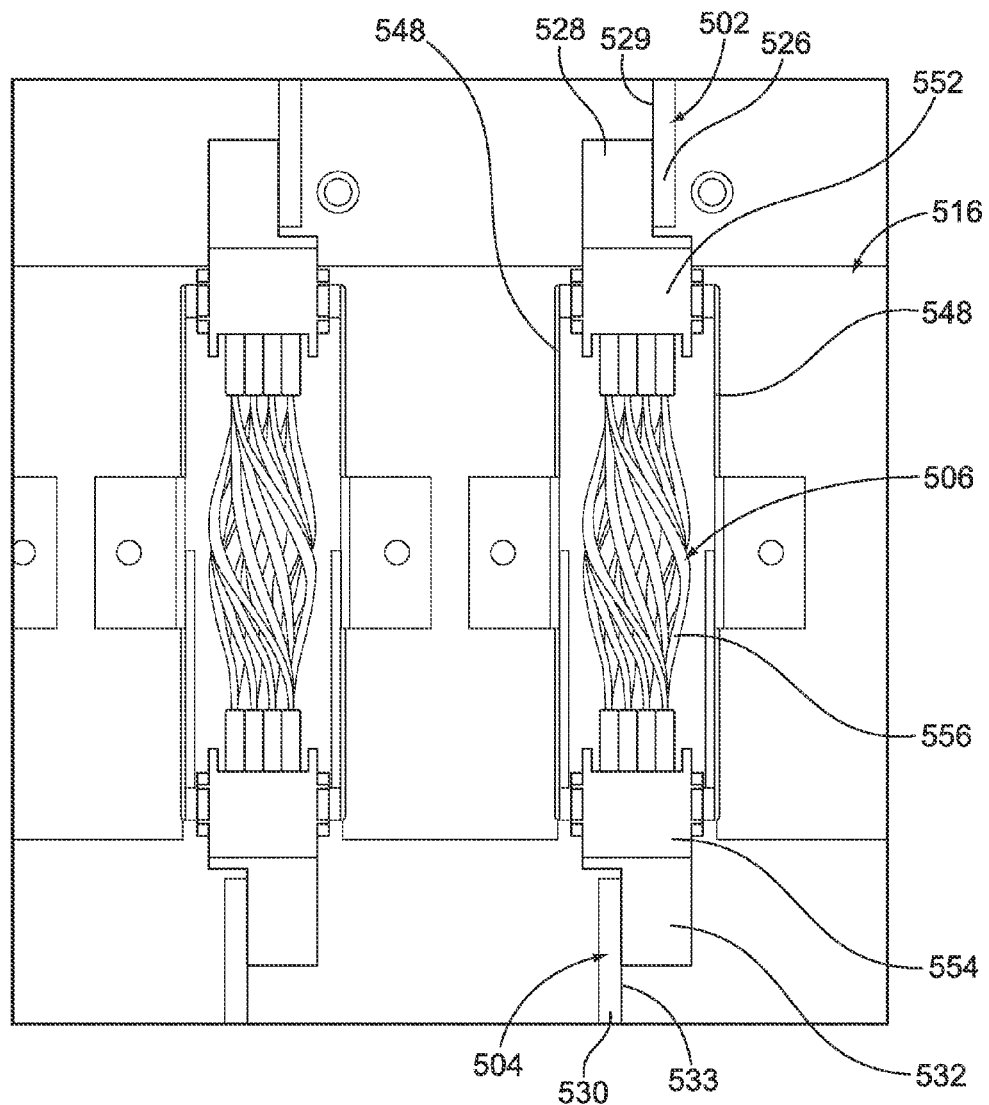
FIG. 10 is a top view of cable assemblies shown in FIG. 9 mounted within the framework.

FIG. 10 is a top view of cable assemblies 506 mounted within the framework 516. The clips 548 hold the first and second header connectors 552, 554 within the framework 516. The rear cards 504 are inverted with respect to the front cards 502. The mounting sides 529 of the circuit boards 526 face in one direction (e.g. to the left in FIG. 10), while the mounting sides 533 of the circuit boards 530 face in the opposite direction (e.g. to the right in FIG. 10). The cables 556 are twisted between the first and second header connectors 552, 554 to maintain the pinout for mating with the inverted receptacle connectors 528, 532.

Figure 11:
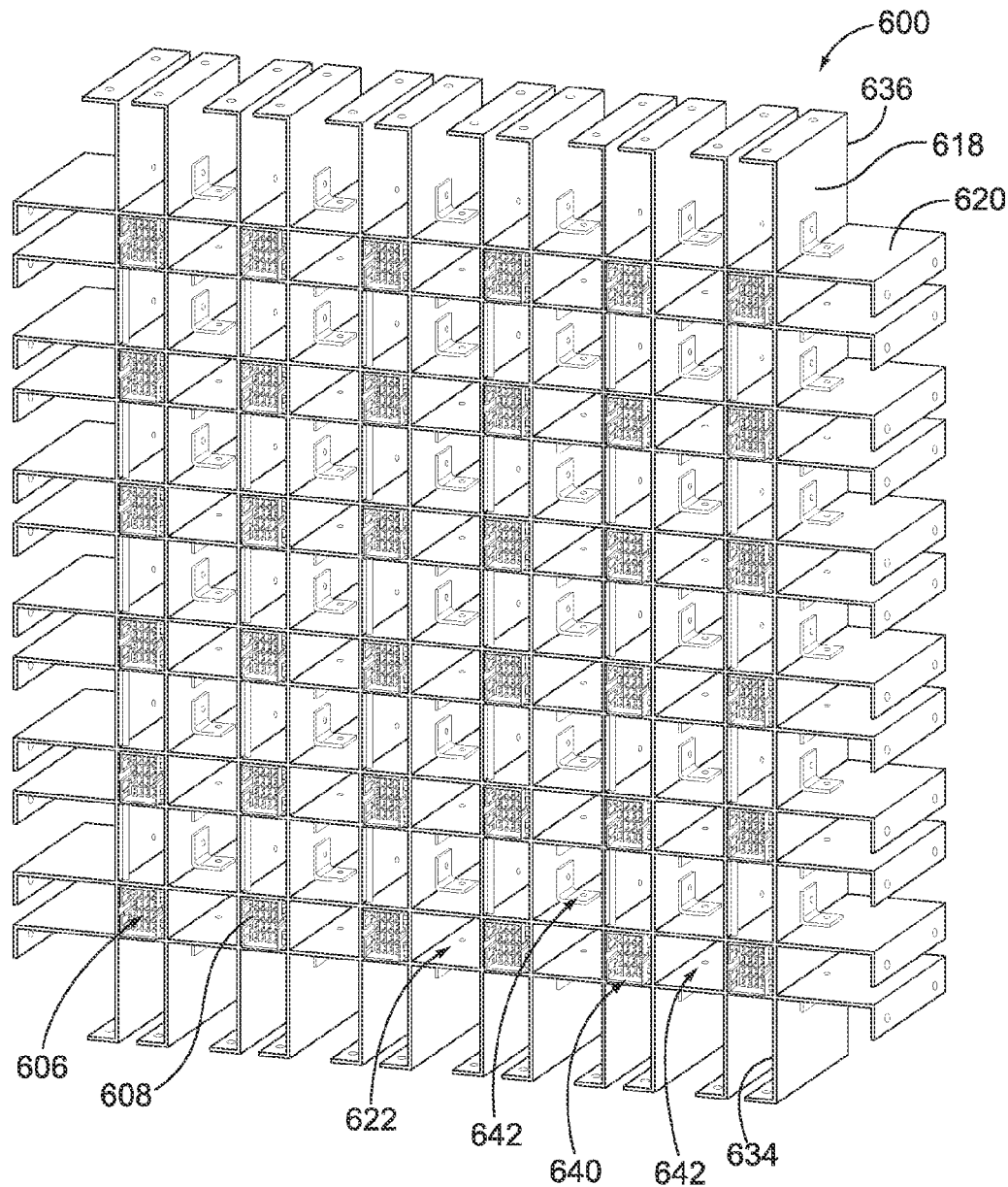
FIG. 11 is a front perspective view of an alternative framework for a connector system formed in accordance with an exemplary embodiment.

FIG. 11 is a front perspective view of an alternative framework 600 for a connector system formed in accordance with an exemplary embodiment. The framework 600 holds cable assemblies 606 having header connectors 608 interconnected by cables (not shown in FIG. 11) that are configured to mate with front cards and rear cards. The cable assemblies 606 may be similar to the cable assemblies 106 (shown in FIG. 1), however the cable assemblies 606 may include different features to hold the cable assemblies 606 in the framework 600. The framework 600 is configured to hold the header connectors 608 in any orientation to provide a coplanar connector system, an inverted coplanar connector system or an orthogonal connector system.

The framework 600 includes a plurality of vertical panels 618 and a plurality of horizontal panels 620 that are arranged in a matrix to define a plurality of cells 622. The cable assemblies 606 are received within corresponding cells 622. A first subset of the cells 622 defines connector cells 640 that are configured to receive the cable assemblies 606. Another subset of the cells 622 define airflow cells 642 extending between first and second ends 634, 636. The airflow cells 642 allow airflow through the framework 600.

Figure 12:
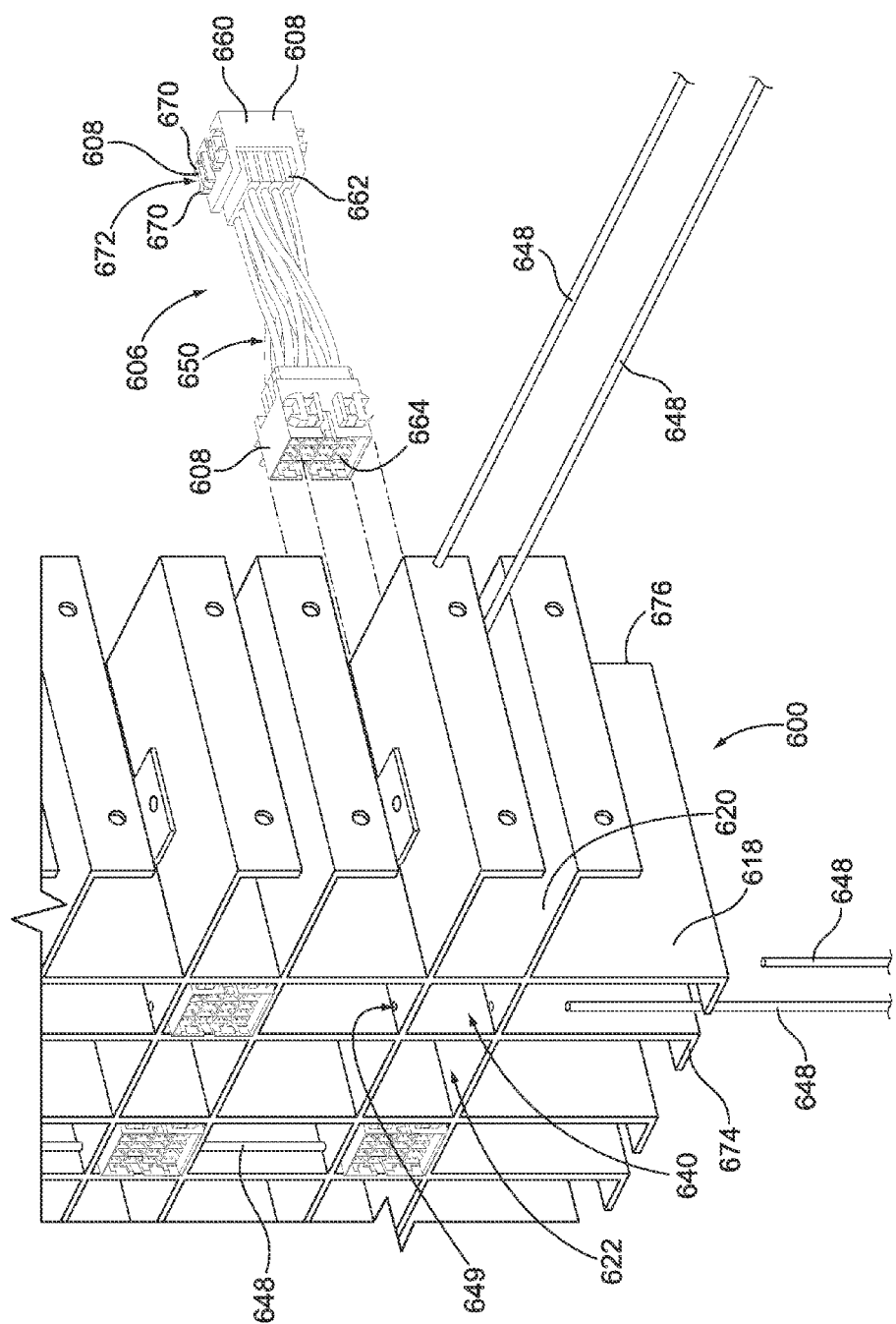
FIG. 12 is a front perspective view of a portion of the framework shown in FIG. 11 with a cable assembly poised for loading into a cell of the framework.

FIG. 12 is a front perspective view of a portion of the framework 600 with one of the cable assemblies 606 poised for loading into the corresponding connector cell 640 of the framework 600. The framework 600 includes a plurality of clips 648 coupled to the vertical panels 618 and/or the horizontal panels 620 to hold the cable assemblies 606 within the corresponding connector cell 640. In the illustrated embodiment, the clips 648 constitute rods that extend a length of the framework 600 such that the clips 648 are received in multiple connector cells 640. The framework 600 includes holes 649 through the vertical panels 618 and/or the horizontal panels 620. The clips 648 are loaded through the holes 649 such that the clips are exposed within the connector cells 640 (as shown in FIG. 11). The header connectors 608 may be clipped to the clips 648 to secure the cable assembly 606 in the connector cell 640.

The cable assembly 606 includes a cable bundle 650 extending between the header connectors 608. In the illustrated embodiment, the header connectors 608 are identical to one another and are arranged at opposite ends of the cable bundle 650 and face in opposite directions. The header connectors 608 include a housing 660 holding a plurality of contact modules 662. Each contact module 662 includes a plurality of signal contacts 664. The housing 660 includes tabs 670 extending from sides thereof. The tabs 670 cooperate to define a channel 672 that receives the clip 648.

In an exemplary embodiment, during assembly, the cable assemblies 606 are loaded into the framework 600. Once positioned, the clips 648 are fed through the holes 649. As the clips 648 are fed through the holes 649, the clips 648 are loaded into the channels 672. The clips 648 hold the position of the header connectors 608 within the framework 600. The clips 648 may be loaded vertically or horizontally into the framework 600 depending on the particular application. In the illustrated embodiment, at a first end 674 of the framework 600, the clips 648 are loaded vertically and at a second end 676 of the framework 600, the clips 648 are loaded horizontally. The clips 648 hold the header connectors 608 at the first end 674 at a first orientation and hold the header connectors 608 at the second end 674 at a second orientation orthogonal to the first orientation. When the clips 648 at both the first and second ends 674, 676 are loaded from the same direction (e.g. both horizontally or both vertically), the clips 648 may hold the header connectors 608 in a coplanar orientation or an inverted coplanar orientation. The clips 648 allow the header connectors 608 to float within the cells 622. For example, the header connectors 608 may slide up or down the clips 648. Alternatively, the clips 648 may bow allowing the header connectors 608 to move side-to-side within the cells 622.

Figure 13:
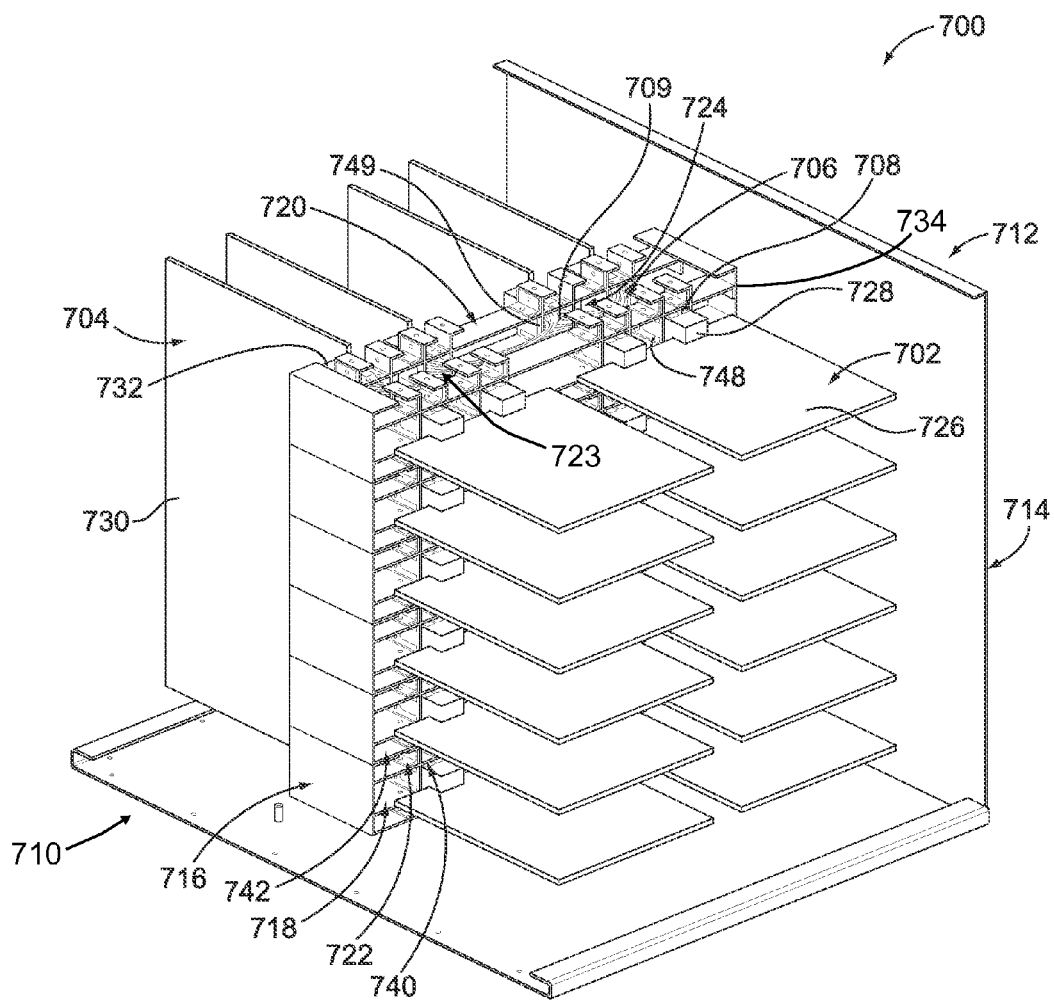
FIG. 13 is a front perspective view of an alternative connector system formed in accordance with an exemplary embodiment.

FIG. 13 is a front perspective view of an alternative connector system 700 formed in accordance with an exemplary embodiment. The connector system 700 represents an orthogonal connector system. The connector system is utilized to connect a plurality of front cards 702 with a plurality of rear cards 704. The front cards 702 are held horizontally and the rear cards 704 are held vertically to define the orthogonal connector system. Alternatively, the front cards 702 and the rear cards 704 may both be oriented vertically or both oriented horizontally.

The connector system 700 utilizes cable assemblies 706 having header connectors 708 interconnected by cables 709 that are configured to mate with the front cards 702 and the rear cards 704. The cable assemblies 706 may be similar to the cable assemblies 106 (shown in FIG. 1), however the cables 709 extending from one header connector 708 may be routed to more than one header connector 708 on the other side of the connector system 700.

The connector system 700 includes a chassis 710 for holding the front cards 702 and rear cards 704. The chassis 710 includes a cabinet 712 having a plurality of walls 714 that define a cabinet 712. A portion of the cabinet 712 (e.g. a top wall and a side wall) is removed for clarity to show other components of the connector system 700. The cabinet 712 may be identical to the cabinet 112 (shown in FIG. 1). A framework 716 is arranged within the cabinet 712, which may be coupled to the walls 714 to hold the framework 716 within the cabinet 712. The framework 716 may be similar to the framework 116 (shown in FIG. 1), however the framework 716 includes front panels 718 and rear panels 720 that cooperate to define the framework 716. The front panels 718 are oriented vertically and horizontally to define cells 722 that hold front header connectors 708 therein. The rear panels 720 are oriented vertically and horizontally to define cells 724 that hold rear header connectors 708 therein.

Each front card 702 includes a circuit board 726 having a plurality of receptacle connectors 728 mounted to an edge thereof. In the illustrated embodiment, the front cards 702 each include two receptacle connectors 728. Two front cards are aligned with one another in each row and mated with the cable assemblies 706. The header connectors 708 are allowed to float in one or more directions within the cells 722 to align the header connectors 708 with the receptacle connectors 728.

Each rear card 704 includes a circuit board 730 and a plurality of receptacle connectors 732 mounted to an edge of the circuit board 730. The rear cards 704 are loaded into the cabinet 712 such that the receptacle connectors 732 mate with corresponding header connectors 708 of the cable assemblies 706. In an exemplary embodiment, the header connectors 708 are able to float within the cells 722 such that the header connectors 708 may be aligned with the receptacle connectors 732 during mating.

In an exemplary embodiment, subsets of the cells 722, 723 define connector cells 740 that are configured to receive the cable assemblies 706. Subsets of the cells 722 define airflow cells 742 extending between a first end 734 and a second end (not shown). The airflow cells 742 allow airflow through the framework 716. Air is allowed to flow into the cabinet 712 through the framework 716. The airflow through the framework 716 helps to reduce the temperature of the circuit boards 726, 728 and/or components on the circuit boards 726, 728 of the front cards 702 and the rear cards 704, respectively.

The connector system 700 includes clips 748 coupled to the front panels 718 to hold the front header connectors 708 within the corresponding connector cells 740. The connector system 700 includes clips 749 coupled to the rear panels 720 to hold the rear header connectors 708 within the corresponding connector cells 740. The clips 748, 749 extend into the connector cell 740 and are configured to engage the header connectors 708 when the cable assembly 706 is loaded into the connector cell 740.

Figure 14:
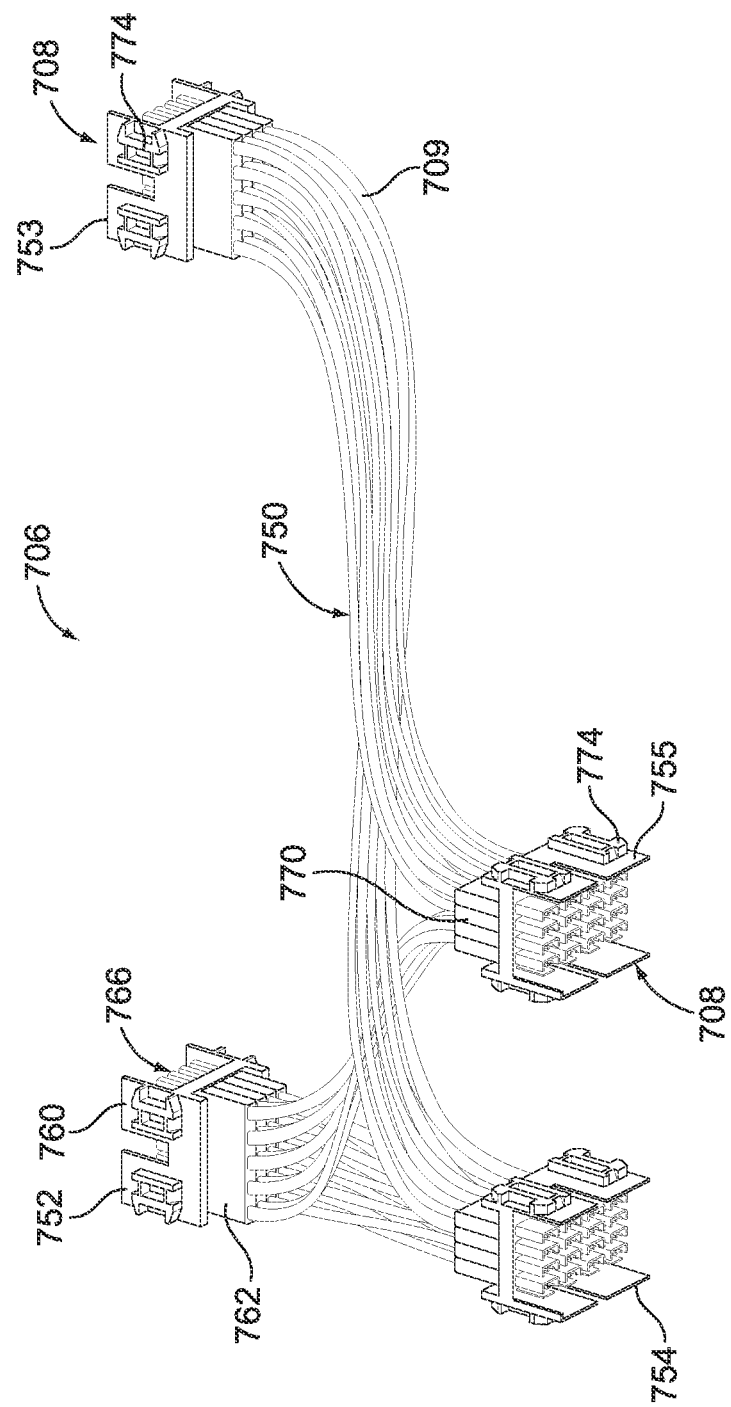
FIG. 14 is a top perspective view of a cable assembly for use with the connector system shown in FIG. 13.

FIG. 14 is a top perspective view of one of the cable assemblies 706. The cable assembly 706 includes a cable bundle 750 extending between the header connectors 708. In the illustrated embodiment, the cable assembly 706 includes four header connectors 708, including a first front header connector 752, a second front header connector 753, a first rear header connector 754 and a second rear header connector 755. Any number of header connectors 708 may be provided in alternative embodiments. The header connectors 752, 753, 754, 755 may be identical to one another. The header connectors 752, 753, 754, 755 may be oriented differently, such as the front header connectors 752, 753 being oriented horizontally and the rear header connectors 754, 755 being oriented vertically. Other configurations are possible in alternative embodiments. The front header connectors 752, 753 face in an opposite direction as the rear header connectors 754, 755.

The cable bundle 750 extends between the header connectors 752, 753, 754, 755. The cable bundle 750 has a plurality of cables 709 that are terminated at one end to one of the front header connectors 752 or 753 and at another end to one of the second header connectors 754, 755. The cables 709 have different lengths. In an exemplary embodiment, the cables 709 constitute twin axial cables having a pair of center conductors that are held within a common jacket. Other types of cables may be used in alternative embodiments.

The header connectors 752, 753, 754, 755 each include a housing 760 holding a plurality of contact modules 762. The housing 760 includes a receiving space 766 that is configured to receive a portion of a corresponding receptacle connector 728 or 732 (shown in FIG. 13). Each contact module 762 includes a plurality of signal contacts (not shown) that extend into the receiving space 766 and are configured to be mated with corresponding receptacle contacts (not shown).

In an exemplary embodiment, the signal contacts form part of a lead frame that is overmolded by a contact module body 770 of the contact module 762. In an exemplary embodiment, during the overmolding process, the ends of the cables 709 are overmolded within the contact module body 770 to secure the cables 709 to the contact modules 762. The cables 709 extend between corresponding contact modules 762. In the illustrated embodiment, the first front header connector 752, includes four contact modules 762. The cables 709 from two of the contact modules 762 are routed to contact modules 762 held by the first rear header connector 754. The cables from the other two contact modules 762 are routed to contact modules 762 held by the second rear header connector 755. Similarly, the second front header connector 753, includes four contact modules 762. The cables 709 from two of the contact modules 762 are routed to contact modules 762 held by the first rear header connector 754. The cables from the other two contact modules 762 are routed to contact modules 762 held by the second rear header connector 755. As such, both front header connectors 752, 753 are electrically coupled to both rear header connectors 754, 755. Alternatively, the front header connectors 752, 753 may be electrically coupled by cables routed between contact modules 762 held by the first and second front header connectors 752, 753. The rear header connectors 754, 755 may be electrically coupled by cables routed between contact modules 762 held by the first and second rear header connectors 754, 755.

The housing 760 includes a plurality of tabs 774 on an exterior of the housing 760. The tabs 774 engage the clips 748 or 749 (shown in FIG. 13) to hold the header connectors 752, 753, 754, 755 within the corresponding connector cell 740 (shown in FIG. 13).

Figure 15:
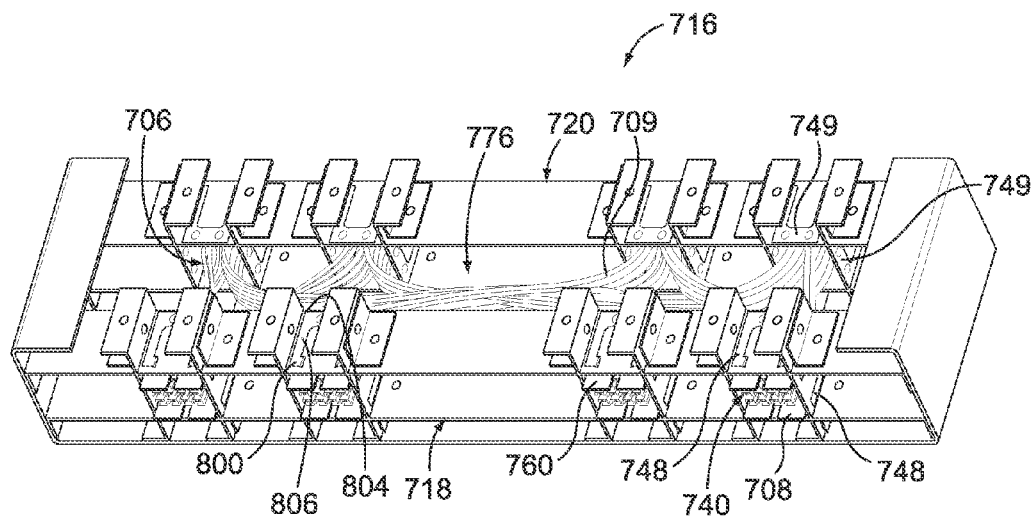
FIG. 15 is a front perspective view of a portion of a framework of the connector system shown in FIG. 13.
Figure 16:
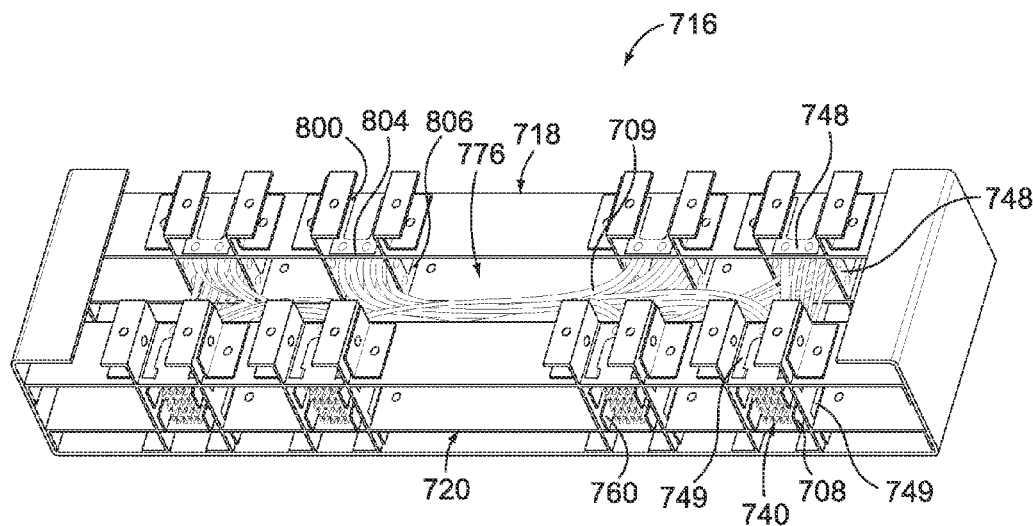
FIG. 16 is a rear perspective view of a portion of a framework of the connector system shown in FIG. 13.

FIGS. 15 and 16 are front and rear perspective views, respectively, of a portion of the framework 716 showing a portion of the front panel 718 and a portion of the rear panel 720. The front and rear panels 718, 720 are separated from one another by a space 776. The cables 709 are routed through the space 776 between the various header connectors 708. FIGS. 15 and 16 show a single row of cable assemblies 706. The row includes two cable assemblies 706, having four front header connectors 708 and four rear header connectors 708. The front header connectors 708 are oriented horizontally. The rear header connectors 708 are oriented vertically.

The header connectors 708 are held within the connector cells 740 by the clips 748, 749. The clips 748 are mounted to the front panels 718 and extend into the connector cells 740 of the front panels 718 to hold the front header connectors 708. The clips 749 are mounted to the rear panels 720 and extend into the connector cells 740 of the rear panels 720 to hold the rear header connectors 708. The clips 748, 749 engage the housings 760 in a similar manner as the clips 148 (shown in FIG. 4) engaging the header connectors 154, 174 (shown in FIG. 4). In an exemplary embodiment, the housing 760 has a square shape and the connector cell 740 has a complementary square shape, which allows the housing 760 to be positioned at any orthogonal position within the connector cell 740. For example, the housing 760 may be rotated at 90°, 180° or 270° and still fit within the connector cell 740.

The clips 748 extend between a first end 800 and a base 804. The clip 748 has a pair of arms 806 extending between the base 804 and the first end 800. The arms 806 are cantilevered from the base 804 and may be deflected in one or more directions. Such deflection allows the header connectors 708 to float within the connector cell 740. The arms 806 function as spring arms that allow such movement of the header connectors 708. Fingers (not shown) extend from the arms 806 into the connector cells 740 to engage the tabs 774 (shown in FIG. 14) of the housing 760. The clips 749 are similar to the clips 748.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable assembly comprising:
   a first header connector comprising a housing holding a plurality of contact modules, each contact module having a plurality of contacts arranged in a row and a dielectric body supporting the contacts, the contact modules being separate from the housing and loaded into the housing and arranged in a stacked configuration with the contact modules being parallel to one another, the housing of the first header connector having a first mating interface;
   a second header connector comprising a housing holding a plurality of contact modules, each contact module having a plurality of contacts arranged in a row and a dielectric body supporting the contacts, the contact modules being separate from the housing and loaded into the housing and arranged in a stacked configuration with the contact modules being parallel to one another, the housing of the second header connector having a second mating interface facing in an opposite direction from the first mating interface, wherein the first and second header connectors are identical to one another; and
   a cable bundle having a plurality of cables extending between the contact modules of the first and second header connectors, the cables being connected between the contacts of the first header connector and corresponding contacts of the second header connector.

2. The cable assembly of claim 1, wherein the cables extend directly between corresponding contacts of the first and second header connectors to create direct electrical paths between the first header connector and the second header connector.

3. The cable assembly of claim 1, wherein the cables have first ends and second ends, the first ends being terminated to corresponding contacts of the first header connector and the second ends being terminated to corresponding contacts of the second header connector.

4. The cable assembly of claim 1, wherein the contacts of the first header connector and the contacts of the second header connector are arranged in differential pairs, the cables being twin axial cables extending between corresponding differential pairs of contacts.

5. The cable assembly of claim 1, wherein the first header connector is oriented such that the contact modules hold the rows of contacts in a horizontal orientation, each contact module of the second header connector being oriented such that the rows of contacts are in a vertical orientation, the cables being twisted between the corresponding contact modules of the first and second header connectors.

6. The cable assembly of claim 1, further comprising a clip coupled between the first header connector and the second header connector, the clip holding the housing of the first header connector in a spaced apart position with respect to the housing of the second header connector.

7. The cable assembly of claim 1, wherein the second header connector is oriented at a rotated position with respect to the first header connector at an angle of either 90°, 180° or 270° with respect to the first header connector, the cables being twisted between the first and second header connectors at the corresponding angle of rotation.

8. The cable assembly of claim 1, wherein the cables have equal length such that signal line lengths between the first and second mating interfaces are the same.

9. The cable assembly of claim 1, wherein the cable assembly defines a midplane connector assembly configured to be coupled between a front card and a rear card.

10. The cable assembly of claim 1, further comprising a third header connector, wherein the cable bundle includes a plurality of cables extending between the third header connector and at least one of the first header connector or the second header connector.

11. The cable assembly of claim 1, wherein the first header connector is oriented such that the contact modules thereof have the rows of contacts in a horizontal orientation, and wherein the second header connector is oriented such that the contact modules thereof have the rows of contacts in a horizontal orientation.

12. The cable assembly of claim 1, further comprising clips coupled between the first header connector and the second header connector, the clips holding the housings of the first and second header connectors at a predetermined spacing, the clips being configured to hold the housing of the first header connector at different orthogonal orientations, the clips being configured to hold the housing of the second header connector at different orthogonal orientations.

13. The cable assembly of claim 1, further comprising a clip coupled between the first header connector and the second header connector, the clip holding the housings of the first and second header connectors at a predetermined spacing, wherein the housing of the first header connector is square-shaped allowing the housing to be coupled to the clip at different orthogonal positions and wherein the housing of the second header connector is square-shaped allowing the housing to be coupled to the clip at different orthogonal positions.

14. The cable assembly of claim 1, further comprising clips forming a box-shaped structure, the housing of the first header connector being shaped to be received in a secured by the clips in a 0° position, a 90° position, a 180° position and a 270° position, the housing of the second header connector being shaped to be received in a secured by the clips in a 0° position, a 90° position, a 180° position and a 270° position, the position of the housing of the second header connector being selected independent of the position of the housing of the first header connector.

* * * * *